United States Patent
Fukuda et al.

(10) Patent No.: US 8,026,482 B2
(45) Date of Patent: Sep. 27, 2011

(54) CHARGED PARTICLE BEAM APPARATUS AND CONTROL METHOD THEREFOR

(75) Inventors: Muneyuki Fukuda, Kokubunji (JP);
 Hiromasa Yamanashi, Sagamihara (JP);
 Sayaka Tanimoto, Kodaira (JP);
 Yasunari Souda, Kawasaki (JP); Osamu Nasu, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 334 days.

(21) Appl. No.: 12/142,284

(22) Filed: Jun. 19, 2008

(65) Prior Publication Data
 US 2009/0140143 A1  Jun. 4, 2009

(30) Foreign Application Priority Data
 Jun. 20, 2007 (JP) ................................. 2007-162286
 Apr. 18, 2008 (JP) ................................. 2008-109502

(51) Int. Cl.
 *G21K 5/00* (2006.01)
 *G21K 1/00* (2006.01)

(52) U.S. Cl. ......................... 250/311; 250/309; 250/310

(58) Field of Classification Search ................. 250/306, 250/307, 309–311, 492.1, 492.3, 505.1
 See application file for complete search history.

(56) References Cited

U.S. PATENT DOCUMENTS

| | | | |
|---|---|---|---|
| 5,983,043 A * | 11/1999 | Ohwaki et al. ................... 399/48 |
| 6,946,656 B2 * | 9/2005 | Ezumi et al. ..................... 850/11 |
| 7,612,570 B2 * | 11/2009 | Suhara ........................ 324/754.22 |
| 7,679,056 B2 * | 3/2010 | Yamanashi et al. ........... 250/310 |
| 2004/0135775 A1 * | 7/2004 | Hurst et al. .................... 345/179 |
| 2004/0171960 A1 * | 9/2004 | Musha et al. ................... 600/544 |
| 2004/0211899 A1 * | 10/2004 | Ezumi et al. ................... 250/310 |
| 2005/0199807 A1 * | 9/2005 | Watanabe et al. .............. 250/306 |
| 2006/0219918 A1 * | 10/2006 | Ezumi et al. ................... 250/311 |
| 2007/0221844 A1 * | 9/2007 | Yamanashi et al. ........... 250/309 |
| 2007/0272858 A1 * | 11/2007 | Tanimoto et al. .............. 250/310 |
| 2008/0056746 A1 * | 3/2008 | Suhara ............................. 399/56 |
| 2010/0294929 A1 * | 11/2010 | Ezumi et al. ................... 250/307 |

FOREIGN PATENT DOCUMENTS
WO 03/007330 A1  1/2003
* cited by examiner

*Primary Examiner* — Bernard E Souw
(74) *Attorney, Agent, or Firm* — Mattingly & Malur, PC

(57) ABSTRACT

Potentials at a plurality of points on a diameter of a semiconductor wafer 13 are measured actually. Then, a potential distribution on the diameter is obtained by spline interpolation of potentials between the actually-measured points adjacent in the diameter direction. Thereafter, a two-dimensional interpolation function regarding a potential distribution in the semiconductor wafer 13 is obtained by spline interpolation of potentials between points adjacent in the circumferential direction around the center of the semiconductor wafer 13. Then, a potential at a observation point on the semiconductor wafer 13 is obtained by substituting the coordinate value of this observation point into the two-dimensional interpolation function. As a result, a potential distribution due to electrification of the wafer can be estimated accurately, and the retarding potential can be set to a suitable value.

17 Claims, 12 Drawing Sheets

$V_R = EV_{UR} + FV_{LR}$
(INTERPOLATED POTENTIAL ON A CONCENTRIC CIRCLE)

CONVENTIONAL METHOD

METHOD OF FIRST EMBODIMENT

METHOD OF THIRD EMBODIMENT

METHOD OF FIRST EMBODIMENT

CHARGED PARTICLE BEAM APPARATUS AND CONTROL METHOD THEREFOR

CLAIM OF PRIORITY

The present application claims priority from Japanese applications JP 2007-162286 filed on Jun. 20, 2007 and JP 2008-109502 filed on Apr. 18, 2008, the contents of which are hereby incorporated by reference into this application.

BACKGROUND OF THE INVENTION

The present invention relates to a charged particle beam apparatus that irradiates a specimen with a charged particle beam and detects secondary charged particles generated from the specimen, and relates to a control method for that apparatus.

As an apparatus for observing a circuit pattern formed on a specimen such as a semiconductor wafer, there is a charged particle beam apparatus. A charged particle beam apparatus is an apparatus that irradiates a specimen with a primary charged particle beam, detects secondary charged particles generated by the irradiation, and expresses and displays these secondary charged particles as an image. In the case where the primary charged particle beam is an electron beam, the charged particle beam apparatus is called a Scanning Electron Microscope (hereinafter, abbreviated as SEM).

In the case of an SEM, when an electron beam goes deeply into a specimen, resolution of secondary charged particles becomes lower. Further, quite a few of specimens have low tolerance to an electron beam. Thus, some SEMs are provided with a mechanism for applying retarding potential to a specimen.

Among specimens, there are specimens that are electrified by themselves. For example, in the case where a specimen is a semiconductor wafer, plasma etching processing or resist coating processing are considered to be a cause of electrification of the specimen. However, it is impossible to explain all the causes of electrification. In any way, a stationary charge that remains even when a specimen is grounded is considered to be a cause of such electrification. Such electrification deflects the path of an irradiated electron beam or shifts a focused focal point. As a result, it takes a time for adjusting an electromagnetic lens or the like to adjust the focus position once again, and throughput of measurement of a minute pattern is largely reduced.

Thus, the below-mentioned Patent Document 1 discloses a technique of estimating an electric potential of a semiconductor wafer. This technique detects potentials at a plurality of points on a line passing through the center of a semiconductor wafer in the course of carrying the semiconductor wafer to a specimen exchange chamber by a delivery robot, and obtains an electric potential distribution function of the semiconductor wafer. In detail, first, potentials at a plurality of points in the radius of a semiconductor wafer are detected, and the potentials at these points are approximated by a quartic function, and then a potential distribution function is obtained by rotating this quartic function about the wafer's center that is taken as the origin. Then, this potential distribution function is used to estimate a potential at a observation point, and the estimated value is fed back to the retarding potential. As a result, focusing is performed in a short time.

Patent Document 1: International Publication WO2003/007330

The technique described in Patent Document 1 however assumes that potential distribution on a wafer becomes concentric, or in other words, 1-fold rotationally symmetric. Thus, in the case where the actual potential distribution is not rotationally symmetric, a large difference occurs between the actual potential distribution and the estimated potential distribution and the retarding potential can not be set to a suitable value, so that measurement at the observation points takes a time.

The present invention focuses on this problem of the conventional technique. And, an object of the present invention is to provide a charged particle beam apparatus that precisely estimates the wafer's potential distribution due to static electrification, and can set setting parameters of a charged particle beam optical system such as a retarding potential and the like to suitable values, and to provide a control method for that apparatus.

SUMMARY OF THE INVENTION

To solve the above problem, the present invention provides a potential measuring unit for detecting potentials at a plurality of points on a surface of a specimen. The potentials detected by the potential measuring unit at the plurality of points are used for interpolating potentials between points adjacent in each of directions that are different from each other, to obtain a two-dimensional interpolation function regarding the potential distribution on the surface of the specimen. For example, in the case where the potential measuring unit measures potentials at a plurality of points arranged linearly on the surface of the specimen, the potentials at the plurality of linearly-arranged points are used to interpolate potentials between adjacent points in each of a plurality of point lines each arranged linearly, to obtain linear direction potential distribution functions. Subsequently, the two-dimensional interpolation function can be obtained by interpolating potentials between points adjacent in the circumferential direction with respect to any point determined by the linear direction potential distribution functions. Then, using this two-dimensional interpolation function, a potential at a observation point on the surface of the specimen is estimated. The estimated potential at the observation point is used to obtain a setting parameter of a charged particle beam optical system.

Here, a plurality of potential measuring units may be provided. For example, potential measuring units may be provided for measuring respectively a plurality of linear directions that are parallel with one another. In that case, the control unit may use potentials that are detected by each of the plurality of potential measuring units with respect to a plurality of points arranged linearly on the surface of the specimen, in order to interpolate potentials between adjacent points in each of the plurality of point lines. Then, the control unit can interpolate potentials between points adjacent in the circumferential direction, to obtain the two-dimensional interpolation function.

Further, for example, it is possible to provide a linear direction potential measuring unit that measures potentials at a plurality of points arranged on a line on the surface of the specimen and a circumferential direction potential measuring unit that measures potentials at a plurality of points arranged in the circumferential direction around the center of the specimen. In that case, the control unit uses the potentials detected by the linear direction potential measuring unit at the plurality of points arranged linearly on the surface of the specimen, in order to obtain a linear direction potential distribution function by interpolating potentials between adjacent points of a plurality of points arranged linearly. And, the control unit uses the potentials detected by the circumferential direction potential measuring unit at the plurality of points arranged in the circumferential direction on the surface of the specimen, in order to obtain a circumferential direction potential distribution function by interpolating potentials between points adjacent in the circumferential direction. Then, the control unit can obtain the two-dimensional interpolation function by weighting each of the linear direction potential distribution function and the circumferential direction potential distribution function, and then by adding the weighted functions.

Here, as the boundary condition for interpolation, conditions characteristic to electrification are considered. For example, since the electrification potential becomes 0 outside the specimen, potential changes discontinuously at the end portion of the specimen. Or, in the case where one of two interpolation directions is the circumferential direction of the specimen, then the potential distribution in the circumferential direction becomes continuous (i.e. connected smoothly) at the location of θ=0 and 2π.

As a function used for interpolation, a spline function is suitable, for example. In spline interpolation, some successive points (mathematically, nodal points) are taken out, and a function for which differential coefficients of curved lines connecting those nodal points become continuous at control points is used. Other than a spline function, a Lagrangian function, a trigonometric function, or a polynomial may be used to perform interpolation. However, the latter functions are not much suitable since a fitting function oscillates when the number of nodal points becomes larger.

As described above, the present invention obtains a two-dimensional interpolation function regarding a potential distribution on the surface of the specimen by interpolating potentials between adjacent points for each of directions different from each other. As a result, even if the potential distribution is not rotationally symmetric, it is possible to estimate accurately a potential on the surface of the specimen by using the two-dimensional interpolation function (potential distribution function). Further, since it is not necessary to obtain a potential distribution function on the basis of potentials measured actually in the radius of the semiconductor as in the case of the technique described in Patent Document 1, a potential distribution function can be obtained on the basis of potentials measured actually at points existing in the wide range of the specimen. As a result, this potential distribution function can be used in order to estimate an accurate potential in all parts of the surface of the specimen.

Thus, setting parameters relating to a potential on the surface of the specimen can be set to a suitable value.

BRIEF DESCRIPTION OF THE DRAWINGS

FIG. 4A is an explanatory diagram showing actual observation points, FIG. 4B is an explanatory diagram showing a method of generating a two-dimensional interpolation function, FIG. 4C is an explanatory diagram showing two-dimensional presentation of estimated potential distribution, and FIG. 4D is an explanatory diagram showing three-dimensional presentation of estimated potential distribution;

FIG. 5A is an explanatory diagram showing the conventional method and FIG. 5B is an explanatory diagram showing the method of the first embodiment;

FIG. 8A is an explanatory diagram showing actual observation points, FIG. 8B is an explanatory diagram showing a method of generating a two-dimensional interpolation function, and FIG. 8C is an explanatory diagram showing two-dimensional presentation of estimated potential distribution;

FIG. 11A is an explanatory diagram showing actual observation points, FIG. 11B is an explanatory diagram showing a method of generating a two-dimensional interpolation function, FIG. 11C is an explanatory diagram showing two-dimensional presentation of estimated potential distribution, and FIG. 11D is an explanatory diagram showing three-dimensional presentation of estimated potential distribution; FIG. 12A is an explanatory diagram showing the method of the first embodiment and FIG. 12B is an explanatory diagram showing the method of the third embodiment.

DETAILED DESCRIPTION

Figure 1:
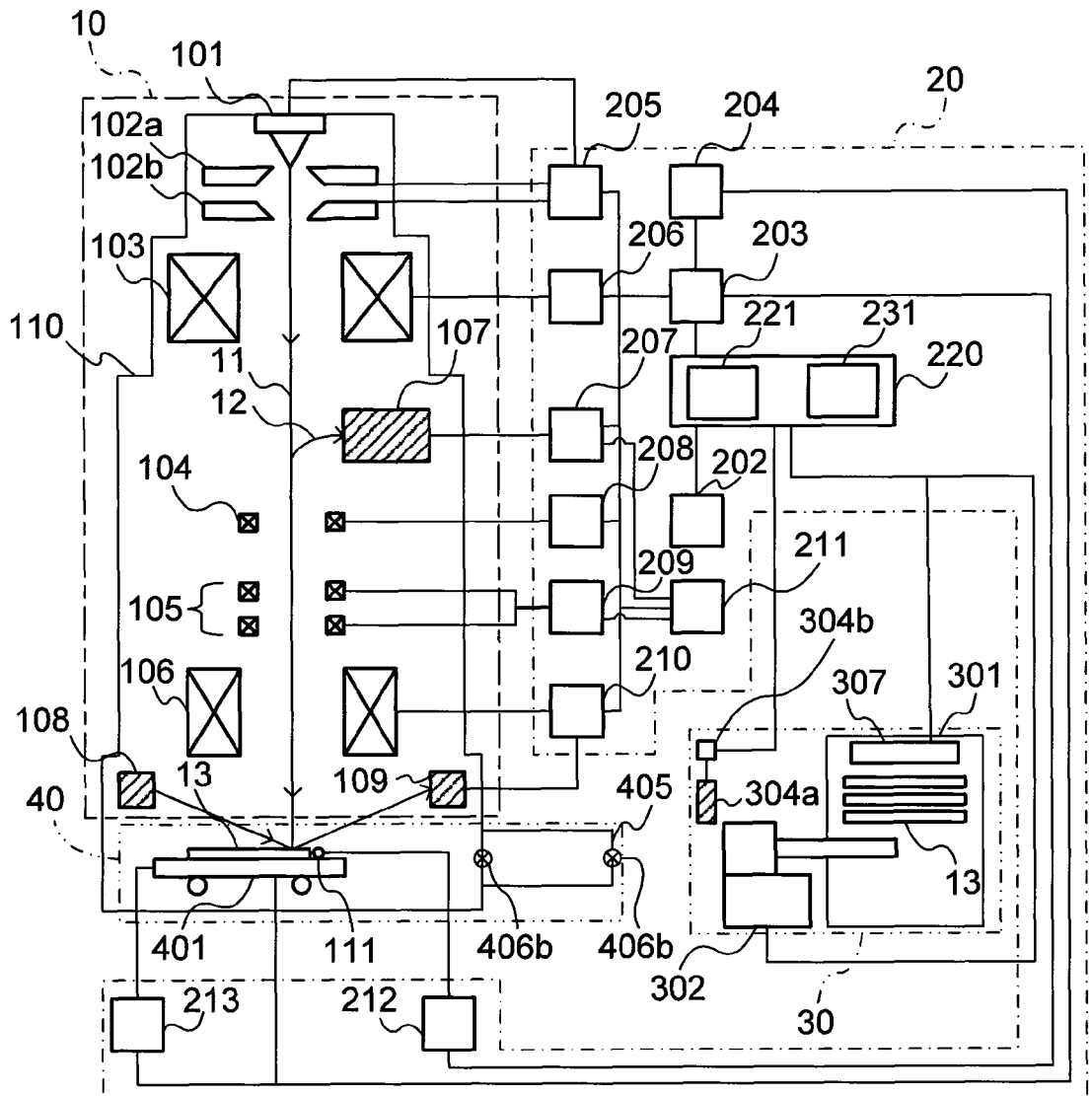
FIG. 1 is a block diagram showing a scanning electron microscope system of a first embodiment according to the present invention.

Now, embodiments of a scanning electron microscope as a charged particle beam apparatus according to the present invention will be described referring to the drawings.

First Embodiment

As shown in FIG. 1, a scanning electron microscope system of a first embodiment comprises subsystems such as an electron beam optical system 10, a control system 20, a transfer system 30 and a specimen chamber 40. In FIG. 1, one-dot chain line and two-dot chain line are virtual lines each showing a boundary of a subsystem.

The electron beam optical system 10 comprises: an electron source 101 for outputting a primary electron beam 11; extraction electrodes 102a and 102b for applying desired accelerating voltages to electrons generated from the electron source 101; a condenser lens 103 for condensing the primary electron beam 11; an alignment coil 104 for adjusting the optical axis of the primary electron beam 11; a scanning deflector 105 for scanning the primary electron beam 11 on a specimen; an objective lens 106 for focusing the primary electron beam 11 onto the specimen; a secondary charged particle(electron) detector 107 for detecting secondary charged particles 12 from the specimen; a height detection laser emission unit 108 for detecting the height of the specimen 13; a height sensor 109 for receiving laser light from the laser emission unit 108 via the specimen; and a retarding pin 111 for applying retarding potential to the specimen.

The transfer system 30 comprises: a wafer cassette 301 for housing a semiconductor wafer 13 as a specimen in the present embodiment; a wafer transfer unit 302 for transferring a semiconductor wafer 13; an aligner 307 for adjusting the direction and the center location of the semiconductor wafer 13; and a potential measuring unit 304 for detecting the potential of the semiconductor wafer 13 in the course of transfer. The potential measuring unit 304 comprises: a probe 304a provided above a linear transfer path for a semiconductor wafer 13; and a measuring unit body 304b.

The specimen chamber 40 comprises: a specimen stage 401 for mounting a semiconductor wafer 13; a specimen exchange chamber 405; and gate valves 406a and 406b provided at an inlet and an outlet of the specimen exchange chamber 405. The above-described electron beam optical system 10 and specimen stage 401 are provided within a vacuum chamber 110. The specimen exchange chamber 405 is provided at an inlet of the vacuum chamber 110.

The control system 20 comprises: an integrated control part 220 for controlling the whole scanning electron microscope system in an integrated manner; a user interface part 202 for inputting a request of a user through a keyboard or the like; an electron beam optical system control unit 203 for controlling the electron beam optical system 10; a stage control unit 204 for controlling the specimen stage 401; an accelerating voltage control unit 205 for controlling the electron source 101 and extraction electrodes 102a, 102b according to instructions from the electron beam optical system control unit 203; a condenser lens control part 206 for controlling the condenser lens 103 according to instructions from the electron beam optical system control unit 203; an amplifier 207 for amplifying a signal from the secondary charged particle detector 107; an alignment control part 208 for controlling the alignment coil 104 according to instructions from the electron beam optical system control unit 203; a deflection signal control part 209 for controlling the scanning deflector 105 according to instructions from the electron beam optical system control unit 203; an objective lens control part 210 for controlling the objective lens 106 according to instructions from the electron beam optical system control unit 203; an image display unit 211; a retarding potential control part 212 for controlling the retarding potential applied to a semiconductor wafer 13; and a stage position detector 213 for detecting the position of the specimen stage 401.

The integrated control part 220 controls the whole system through the electron beam optical system control unit 203, the stage control unit 204 and the like according to inspection recipe information (the accelerating voltage of the primary charged particles, information on a semiconductor wafer 13, positional information on observation points and the like) inputted by the operator through the user interface part 202. The integrated control part 220 comprises an operation part 221 and a storage part 231. The storage part 231 comprises a semiconductor memory, for example. The storage part 231 stores information and programs required for integrated control of the whole system, and further stores various kinds of data obtained in the course of operation of the system. The operation part 221 executes programs required for the integrated control.

Under control of the electron optical system control unit 203, the accelerating voltage control unit 205 controls the accelerating voltage of the primary electron beam 11 such that the accelerating voltage becomes a suitable value for observation and analysis of the specimen. Similarly, under control of the electron beam optical system control unit 203, the condenser lens control part 206 sets the exciting current of the condenser lens 103 to a suitable value for controlling the amount of the current and the divergence angle of the focused electron beam 11. At that time, the electron beam optical system control unit 203 sends an imperfect alignment correction value for the primary electron beam 11 to the alignment control part 208. The objective lens control part 210 sets the exciting current value for the objective lens 106 such that the focused focal point of the electron beam 11 is located on the specimen. The value to be set is sent from the electron beam optical system control unit 203. The deflection signal control part 209 supplies a deflection signal to the scanning deflector 105 for deflecting the electron beam 11, and transmits the deflection signal to the electron beam optical system control unit 203. The transmitted deflection signal is used as a reference signal for reading an output signal of the amplifier 207. The operation part 221 of the integrated control part 220 reads an output signal from the secondary charged particle detector 107 synchronously with the timing of electron beam scanning, and generate an observation image to be displayed on the image display unit 211.

Here, an outline of operation of the scanning electron microscope of the present embodiment will be described.

Receiving an instruction from the integrated control part 220, the wafer transfer unit 302 takes out a semiconductor wafer 13 from the wafer cassette 301. Then, when the gate valve 406a (which isolates the specimen exchange chamber 405 kept in a vacuum from the outside that is under the atmospheric pressure) is opened, the wafer transfer unit 302 carries the semiconductor wafer 13 into the specimen exchange chamber 405. The semiconductor wafer 13 placed in the specimen exchange chamber 405 is transferred into the vacuum chamber 110 through the gate valve 406b and fixed on the specimen stage 401.

To measure a circuit pattern on the semiconductor wafer 13 at a high speed, it is necessary to detect the height of the semiconductor wafer 13 when the specimen stage 401 moves to a desired observation point, and adjust the focal distance of the objective lens 106 depending on the detected height. That is to say, so-called focusing control is required. Thus, the present embodiment is provided with the height detection laser emission unit 108 and the height sensor 109 for receiving laser light from the laser emission unit 108 via the specimen.

When the stage position detector 213 detects the position of the specimen stage 401 and the integrated control part 220 recognizes approach of the specimen stage 401 to the neighborhood of a desired position, the height detection laser emission unit 108 is made to irradiate laser light onto the semiconductor wafer 13 placed on the specimen stage 401. Then, the height sensor 109 receives light reflected from the semiconductor wafer 13, and detects the height of the semiconductor wafer 13 on the basis of the position of receiving the reflected light. Thus-obtained height information of the semiconductor wafer 13 is fed back to the focal distance of the objective lens 106. In other words, the objective lens control part 210 adjusts the focal distance of the objective lens 106 on the basis of the height information detected by the height sensor 109 with respect to the semiconductor wafer 13.

The primary electron beam 11 is extracted from the electron source 101 by the extraction electrodes 102a and 102b. The primary electron beam 11 is focused by the condenser lens 103 and the objective lens 106, to irradiate the semiconductor wafer 13 on the specimen stage 401. Here, the primary electron beam 11 extracted from the electron source 101 is adjusted in its path by the alignment coil 104, and is made to scan the semiconductor wafer 13 two-dimensionally by the scanning deflector 105 that receives the signal from the deflection signal control part 209.

In the present embodiment, the objective lens 106 is an electromagnetic lens, and its focal distance is determined by the exciting current. The exciting current required for focusing the primary electron beam 11 on the semiconductor wafer 13 is expressed as a function of the accelerating voltage of the primary electron beam 11, the surface potential of the semiconductor wafer 13 and the above-mentioned height of the semiconductor wafer 13. This function can be derived by optical simulation or by actual measurement.

The retarding potential control part 212 applies the retarding potential to the semiconductor wafer 13 on the specimen stage 401 through the retarding pin 111 for decelerating the primary electron beam 11. Owing to irradiation of the semiconductor wafer 13 with the primary electron beam 11, secondary charged particles 12 are released from the semiconductor wafer 13. The secondary charged particles 12 are detected by the secondary charged particle detector 107 whose signal is used as a brightness signal for the image display unit 211 through the amplifier 207. The image display unit 211 is synchronized with the deflection signal that is outputted from the deflection signal control part 209 to the scanning deflector 105. As a result, the shape of the circuit pattern formed on the semiconductor wafer 13 is reproduced faithfully on the image display unit 211. Here, the secondary charged particles 12 are charged particles released secondarily from the semiconductor wafer 13 when the semiconductor wafer 13 is irradiated with the primary electron beam 11, and generally called secondary electrons, auger electron, reflection electrons, or secondary ions.

The integrated control part 220 performs judgment of focused state of the primary electron beam irradiation (focusing state judgment of the primary electron beam), by performing image processing of an observation image for each change of setting of the objective lens control part 210 or the retarding potential control part 212. As a result, when the specimen stage 401 reaches a prescribed position, the primary electron beam 11 is focused on the semiconductor wafer 13. Thus, detection of the circuit pattern of the semiconductor wafer 13 can be performed automatically without operation by the operator.

Here, in the case where the semiconductor wafer 13 is not electrified, the primary electron beam 11 can be focused on a observation point (i.e. a point to be irradiated by the primary electron beam 11) by feeding back the height information (detected by the height sensor 109) at the observation point on the semiconductor wafer 13 to the focal distance of the objective lens 106, as described above. Because, in the case of non-electrification, the surface potential of the semiconductor wafer 13 becomes equal to the retarding potential regardless of the location of the observation point, and thus the objective lens exciting current required for focusing becomes a function of the accelerating voltage of the primary electron beam 11 and the height of the semiconductor wafer 13 on condition that the accelerating voltage of the primary electron beam 11 is constant.

However, in the case where the semiconductor wafer 13 is electrified, the surface potential of the semiconductor wafer 13 changes depending on the location irradiated with the beam. Thus, it is necessary that a function of the objective lens exciting current required for focusing be a function of not only the accelerating voltage of the primary electron beam 11 and the height of the semiconductor wafer 13 but also the surface potential of the semiconductor wafer 13. In other words, it is impossible to focus the primary electron beam 11 on an observation point without considering surface potential information of the specimen in controlling the focal distance of the objective lens 106. The height information of a observation point can be obtained just before the observation (i.e. in real time) by using the height detection laser emission unit 108 and the height sensor 109. However, from the practical viewpoint, it is difficult to measure the surface potential at the location to be irradiated with the electron beam just before the observation (i.e. just before irradiation by the electron beam). Thus it is necessary to estimate the surface potential distribution of the specimen in advance and feed back the estimation to focus adjustment of the electron beam optical system 10. Thus, in the present embodiment, electrification potentials on the diameter of the semiconductor wafer 13 are actually measured in the course of transfer before the observation. Then, a two-dimensional interpolation function indicating potential distribution is obtained based on the measured values. And, potentials at observation points on the specimen are estimated by using the obtained interpolation function.

The above-mentioned two-dimensional Interpolation function calculation processing, observation point potential calculation processing and focus adjustment processing of electron beam optical system 10 are performed when the operation part 221 of the integrated control part 220 executes programs stored in the storage part 231.

Figure 2:
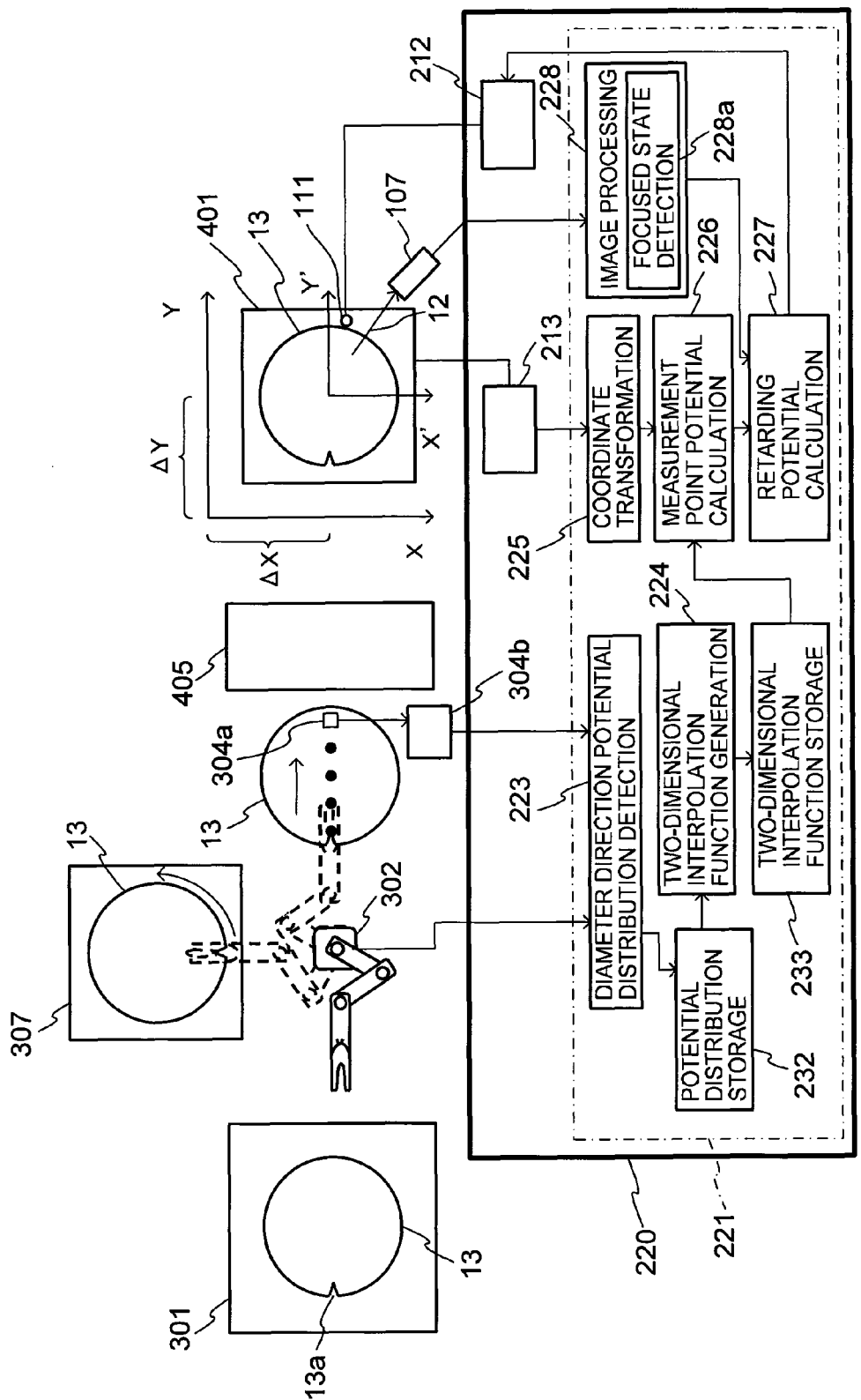
FIG. 2 is an explanatory diagram showing a functional configuration of an integrated control part and a configuration of a transfer system of the first embodiment according to the present invention.

As shown in FIG. 2, from the functional viewpoint, the integrated control part 220 comprises: a diameter direction potential distribution detection part 223 that obtains potentials at a plurality of points on the diameter of the semiconductor wafer 13 on the basis of potential information from the potential measuring unit 304 and wafer position information from an encoder or the like of the wafer transfer unit 302; a potential distribution storage part 232 that stores the potentials obtained by the diameter direction potential distribution detection part 223 with respect to the plurality of points on the diameter of the semiconductor wafer 13; a two-dimensional interpolation function generation part 224 that generates a two-dimensional interpolation function concerning potential distribution expressed on the polar coordinate system having the origin at the center of the semiconductor wafer 13; a two-dimensional interpolation function storage part 233 that stores the generated two-dimensional interpolation function; a coordinate transformation part 225 that transforms a coordinate value of an irradiated location (i.e. a observation point) on the semiconductor wafer 13, which is detected by the stage position detector 213, on the orthogonal coordinate system into a coordinate value on the polar coordinate system; a observation point potential calculation part 226 that calculates the potential at that observation point by using the two-dimensional interpolation function; a retarding potential calculation part 227 that obtains the retarding potential on the basis of the potential at that observation point; and an image processing part 228 that performs image processing with respect to the signal received from the secondary charged particle detector 107. The image processing part 228 comprises a focused state detection part 228a that judges whether a focused state is realized or not.

Among the above-mentioned functional components, the potential distribution storage part 232 and the two-dimensional interpolation function storage part 233 are both secured in the storage part 231 of the integrated control part 220.

Next, processing operation of the integrated control part 220, specifically details of the above-mentioned two-dimensional interpolation function calculation processing, observation point potential calculation processing and focus adjustment processing of electron beam optical system 10, will be described according to the flowchart shown in FIG. 3.

When a user of the apparatus clicks a start button in a GUI screen displayed on the image display unit 211, the integrated control part 220 makes the wafer transfer unit 302 operate so that a semiconductor wafer 13 is taken out from the wafer cassette 301 and moved onto the aligner 307 as shown in FIG. 2 (S1). Subsequently, the integrated control part 220 makes the aligner 307 perform adjustment of the central axis of the semiconductor wafer 13 and related processing (S2).

Usually, the semiconductor wafer 13 is formed with a cutout portion called a notch 13a. The aligner 307 adjusts the position of the semiconductor wafer 13 such that the notch 13a faces a prescribed direction and at the same time the rotation center of the aligner 307 coincides with the center of the semiconductor wafer 13. The position of the notch 13a is monitored by an optical sensor or the like of the aligner 307. Since it is not known which direction the notch 13a faces when the semiconductor wafer 13 is brought on to the aligner 307, the aligner 307 rotates the semiconductor wafer 13 on a rotating platform at least one rotation, and stops the rotation of the wafer 13 when the rotation center of the aligner 307 coincides with the center of the semiconductor wafer 13 and the notch 13a faces the prescribed direction.

When the aligner 307 finishes the adjustment of the position and direction of the semiconductor wafer 13 (S3), then the integrated control part 220 makes the wafer transfer unit 302 transfer the semiconductor wafer 13 linearly toward the specimen exchange chamber 405 (S4).

In the course of the linear transfer of the semiconductor wafer 13, potentials are detected at a plurality of points on a line passing through the center and the notch 13a of the semiconductor wafer 13 (S5). At that time, diameter direction potential distribution detection part 223 of the integrated control part 220 obtains potential distribution on the diameter of the semiconductor wafer 13 on the basis of the potential information from the potential measuring unit 304 and the wafer position information from the encoder or the like of the wafer transfer unit 302, and stores the obtained potential distribution in the potential distribution storage part 232. The potential distribution storage part 232 stores coordinate values of the potential detection locations and the respective potentials at those coordinate values in association with the respective coordinate values.

Next, using the potentials at the plurality of points on the line passing through the semiconductor wafer 13, the two-dimensional interpolation function generation part 224 of the integrated control part 220 performs spline interpolation between potentials of detection points adjacent in the direction of the line passing through the center of the semiconductor wafer 13 and spline interpolation between potentials of detection points adjacent in the circumferential direction, to obtain a two-dimensional interpolation function concerning the potential distribution of the semiconductor wafer 13, and stores the obtained two-dimensional interpolation function in the two-dimensional interpolation function storage part 233 (S6). Details of the generation of this two-dimensional interpolation function will be described later. Further, this processing of generating the two-dimensional interpolation function can be performed at any time before the below-described step S12.

Thereafter, the wafer transfer unit 302 sets the semiconductor wafer 13 on the specimen stage 401 through the specimen exchange chamber 405 (S7). The inside of the specimen exchange chamber 405 is kept in a decompressed state by the gate valve 306a. When the semiconductor wafer 13 is brought in, the gate valve 306a is released so that the inside pressure of the specimen exchange chamber 405 becomes the atmospheric pressure. When bring in to the specimen exchange chamber 405 is finished, the gate valve 306a is closed. Thereafter, when the internal pressure of the specimen exchange chamber 405 becomes equal to the internal pressure of the vacuum chamber 110, the gate valve 306b is opened and the semiconductor wafer 13 is set on the specimen stage 401. Then, by moving the stage, the semiconductor wafer 13 is moved to the position just under the electron optical lens barrel. To describe more strictly, it is necessary to go through a step of rough positioning by a light microscope in order to move the wafer to the electron beam irradiation position for obtaining a high magnification image used for measurement and inspection of the wafer. However, its description is omitted to avoid complications.

Next, as shown in FIG. 2, the integrated control part 220 obtains offset values ($\Delta X$, $\Delta Y$) between the origin of the stage coordinate system (X-Y coordinate system) and the center of the semiconductor wafer 13 on the specimen stage 401, sets a new X'-Y' coordinate system having the origin at the center of the semiconductor wafer 13, and then sets a polar coordinate system having the origin at the origin of the X'-Y' coordinate system (S8). Here, the Y direction and Y' direction of the X-Y coordinate system and the X'-Y' coordinate system are both the direction of transfer by the wafer transfer unit 302. And, the X direction and X' direction are both perpendicular to the Y direction and the Y' direction. Further, the offset values ($\Delta X$, $\Delta Y$) are obtained from a sensor (not shown) for detecting the position of the semiconductor wafer 13 on the specimen stage 401.

Next, the integrated control part 220 instructs the stage control unit 204 to make the specimen stage 401 move so that an alignment pattern provided in the neighborhood of one observation point among the plurality of observation points previously inputted to the integrated control part 220 comes to the location irradiated with the primary electron beam (S9). After this movement of the stage to the alignment pattern, the integrated control part 220 makes the height sensor 109 measure the height at the observation point, and transfers the height information to the objective lens control part 210 and the electron optical system control unit 203 (S10). As this alignment pattern, one located at a position very near to the observation point (for example, at a distance of several microns from the observation point) is selected. Thus, it can be said that the location irradiated with the primary electron beam is substantially the observation point.

After the measurement of the height is finished, the integrated control part 220 sets a focus condition of the objective lens 106 (S11). Although, in fact, the accelerating voltage and current value of the primary electron beam are set before setting the focus condition, these setting steps are omitted in FIG. 3. In the focus setting of the objective lens 106, the exciting current value for the objective lens 106 is read out from an exciting current table stored in the electron optical system control unit 203, and transferred to the objective lens control unit 210. In this step, although an image is, broadly speaking, in focus, a completely-focused state is not attained owing to the effect of the surface potential of the semiconductor wafer 13. Thus, it is necessary to make fine adjustments to the focus by adjusting the retarding potential.

The observation point potential calculation part 226 of the integrated control part 220 calculates the potential at the observation point by using the two-dimensional interpolation function stored in the two-dimensional interpolation function storage part 233 (S12). At that time, since the two-dimensional interpolation function is expressed by using variables of the polar coordinate system, the coordinate transformation part 225 transforms the X-Y coordinate value of the observation point detected by the stage position detector 213 into the polar coordinate value. The observation point potential calculation part 226 substitutes the polar coordinate value of the observation point into the two-dimensional interpolation function, to obtain the potential at the observation point.

Next, the retarding potential calculation part 227 of the integrated control part 220 calculates the retarding potential Vr by using the potential Vexp at the observation point (S13).

As described above, in the case where the semiconductor wafer 13 is not electrified, the surface potential of the semiconductor wafer 13 is equal to the retarding potential. On the other hand, in the case where the semiconductor wafer 13 is electrified, the surface potential of the semiconductor wafer 13 is the sum of the retarding potential and the potential owing to the electrification of the semiconductor wafer 13. Accordingly, to make the surface potential of the semiconductor wafer 13 coincide with the same constant potential as the one in the case of non-electrification of the semiconductor wafer 13, it is necessary to correct the retarding potential applied to the semiconductor wafer 13. Expressing the potential due to electrification of the semiconductor wafer 13 as Vs, the retarding potential in the case of non-electrification as Vo, and the retarding potential in the case of existence of electrification as Vr, the retarding potential Vr can be set as Vr=Vo−Vs. By this, it becomes possible to cancel the effect of the surface potential on the exciting current of the objective lens 106, so that the conditions of the exciting current required for focusing the primary electron beam 11 onto the semiconductor wafer 13 can be treated similarly to the case where the semiconductor wafer 13 is not electrified. That is to say, if the accelerating voltage of the primary electron beam 11 is constant, it becomes possible that the primary electron beam 11 is focused on an observation point of the semiconductor wafer 13 by feeding back the height information detected by the height sensor 109 at the observation point to the focal distance of the objective lens 106.

Figure 6:
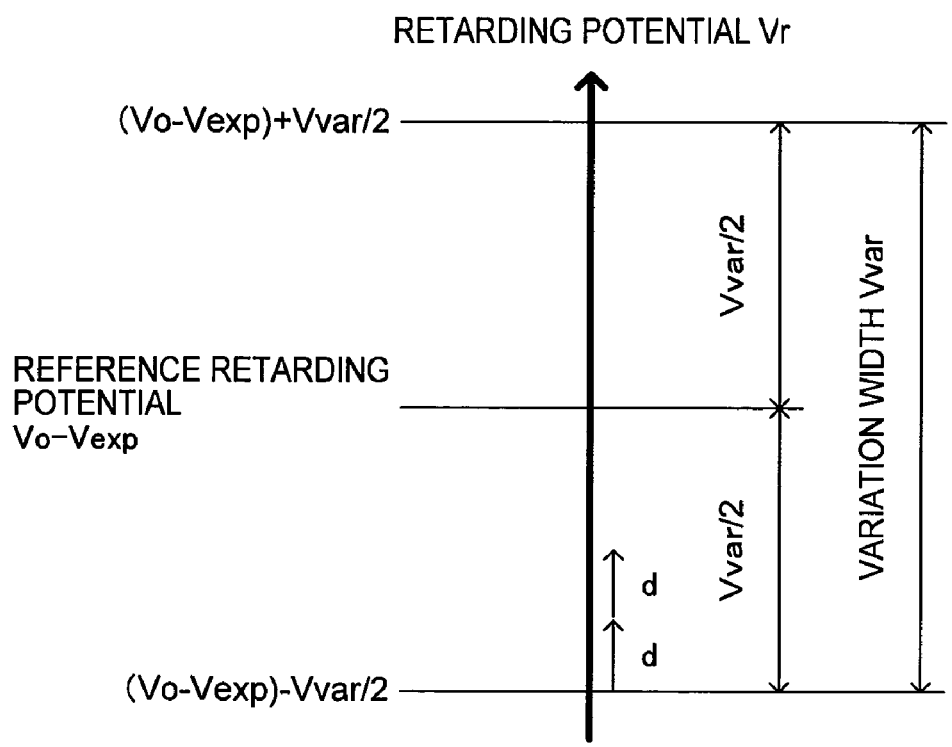
FIG. 6 is an explanatory diagram for explaining a method of setting retarding potential in the first embodiment according to the present invention.

Even if the two-dimensional interpolation function is used, it is difficult to reproduce completely the surface potential distribution of the semiconductor wafer 13 since the function is obtained on the basis of measured data at a limited number of points. Thus, in the present embodiment, a secondary charged particle scanning image is obtained while changing the retarding potential Vr in units of a suitable value d within a certain range Vvar, the focused state judgment of each of the two or more image data is executed. Here, as shown in FIG. 6, first, the potential Vexp affected by electrification at the observation point is subtracted from the retarding potential Vo in the case of non-electrification, the resultant potential (Vo−Vexp) is taken as a reference retarding potential, and an initial retarding potential Vr is determined as a potential obtained by subtracting the half value (Vvar/2) of the potential variation width Vvar from the reference retarding potential (S13).

When the retarding potential Vr is calculated, the retarding potential calculation part 227 sets that value Vr in the retarding potential control part 212 (S14). When the value of the retarding potential is set, the retarding potential control part 212 applies the retarding potential of this value to the retarding pin 111 of the specimen stage 401.

The integrated control part 220 instructs the electron optical system control unit 203 to make the primary electron beam irradiate the semiconductor wafer 13 on the specimen stage 401 (S15). As described above, this primary electron beam is extracted from the electron source 101 by the extraction electrodes 102a and 102b, focused by the condenser lens 103 and the objective lens 106, and irradiated onto the semiconductor wafer 13 on the specimen stage 401.

By this irradiation of the semiconductor wafer 13 with the primary electron beam, secondary charged particles 12 are released from the semiconductor wafer 13 and detected by the secondary charged particle detector 107. The output from the secondary charged particle detector 107 is amplified by the amplifier 207, sent to the focused state detection part 228a of the integrated control part 220, and the focused stage detection part 228a judges whether a focused state is realized or not (S16). This judgment is performed by judging the sharpness of the secondary charged particle scanning image. For example, by filtering the image to highlight the edges of the alignment pattern, the focusing judgment can be made by considering the resultant contrast. When the focused state is realized, the processing goes to the below-described step S20. On the other hand, when the focused state is not realized, the prescribed increment value d is added to the previously-determined retarding potential Vr to obtain the result as a new retarding potential Vr (S17). Then, it is judged whether the new retarding potential Vr is larger than the upper limit ((Vo−Vexp)+Vvar/2) or not (S18).

In the case where the new retarding potential Vr is larger than the upper limit to the retarding potential, the processing returns to the step S9, and the specimen stage 401 is moved so that a new observation point comes to the location to be irradiated, and performs the step 10 and the following steps. On the other hand, in the case where the new retarding potential Vr is less than or equal to the upper limit to the retarding potential, the new retarding potential Vr is set similarly to the step S14 (S19), and then it is judged whether the state is a focused state or not (S16). Then, until it is judged that the state is a focused state, the processing of the steps S16-S19 are repeated unless the retarding potential Vr exceeds the upper limit.

When it is judged in the step S16 that the focused state is realized, actual measurement at the observation point is executed (S20). When the measurement at the observation point is finished, the integrated control part 220 judges whether another observation point remains or not (S20). The above processing of the steps S9-S21 is repeated until no observation point remains.

In the above processing, when the retarding potential Vr exceeds the upper limit in the step S18, the location to be irradiated with the primary electron beam is moved to the next observation point. Instead, the variation width Vvar of the retarding potential Vr may be set to a larger value once again, to search for the optimum value of the retarding potential Vr. In that case, when a focused state is not realized even if resetting of the retarding potential is repeated several times, it is considered that either the prescribed exciting current value of the objective lens 106 or the calculated surface potential distribution function has some problem, the measurement of the height or the measurement of the surface potential of the semiconductor wafer 13 may be performed again.

In the above-described embodiment, the retarding potential Vr is varied (changed) in units of the value d within the variation width Vvar, and thus a time required for obtaining the optimum value of the retarding potential Vr is proportional to (Vvar/d). Thus, from the viewpoint of reduction of measurement time, it is favorable that the variation width Vvar is smaller as far as possible. On the other hand, if the variation width Vvar is too small, it is more possible that the optimum value is out of the variation width Vvar of the retarding potential Vr, and many times it becomes impossible to perform the focusing adjustment automatically. However, in the present embodiment, the prediction accuracy of a potential of a semiconductor wafer 13 is improved by use of a two-dimensional interpolation function, as described above. As a result, the variation width Vvar can be made smaller, and the optimum value of the retarding potential Vr can be obtained at a high speed.

The above-described focus setting is repeated for each observation point. This affects largely the processing time per wafer. For example, as regards length measurement, a time of 0-3 seconds is required in the present circumstances for each observation point in the optimum value determination step for the retarding potential. This is almost equal to a time of 0-3 seconds required for each observation point after finish of the focus adjustment. Thus, high speed obtainment of the optimum value of the retarding potential Vr is very valuable for improvement of throughput of the measurement as a whole.

Figure 4A:
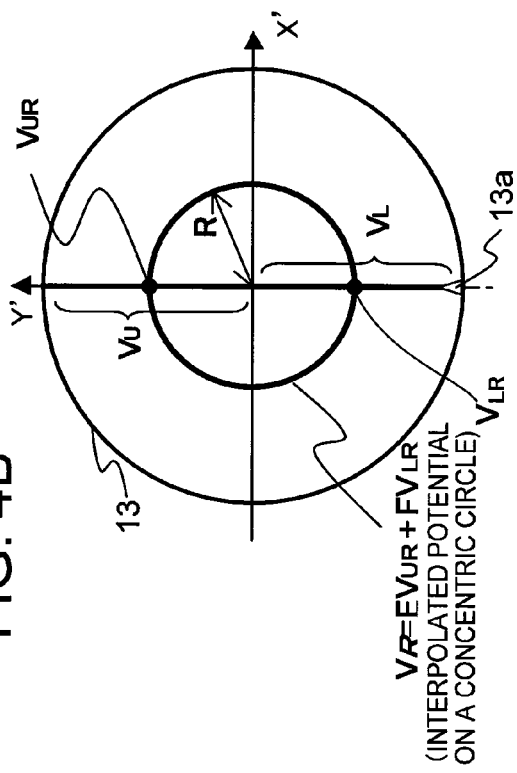
FIGS. 4A, 4B, 4C and 4D are explanatory diagrams for the first embodiment according to the present invention.

Next, a method of generating the above-mentioned two-dimensional interpolation function will be described. As shown in FIG. 4A, it is assumed here for the sake of convenience that the diameter of the semiconductor wafer 13 is 300 mm. Thus, in the above-described X'-Y' coordinate system having its origin at the center of the semiconductor wafer 13, the notch 13a is located at (0, −150). In this X'-Y' coordinate system, potential detection points are a point located at the position of (0, 0) (i.e. the center of the semiconductor wafer 13), five points on the Y' axis on the side of the (+)Y direction (i.e. on the side of the bring-in direction), and five points on the Y' axis on the side of the (−)Y direction (i.e. on the side of the taking-out direction), eleven points in total. The intervals between adjacent points are same one another.

First spline interpolation is performed with respect to measured data at the eleven points by using the following equation Eq. 1, to estimate potential distribution on the Y' axis. Here, potential distribution on the (−) side of the Y' axis is written as $V_L$ and potential distribution on the (+) side of the Y' axis as $V_U$, and the potential distribution on the Y' axis is estimated being divided into two parts. Although various functions can be used as a spline interpolation function, here interpolation is performed by using the measured data and second order derivatives of the measured data.

$$V_L = AV_i + BV_{i+1} + CV_i'' + DV_{i+1}'' \qquad \text{Eq. 1}$$

Each coefficient A, B, C, D in Eq. 1 is defined as in Eq. 2.

$$A = \frac{Y_{i+1} - Y}{Y_{i+1} - Y_i} \qquad \text{Eq. 2}$$

$$B = \frac{Y - Y_i}{Y_{i+1} - Y_i}$$

$$C = \frac{1}{6}(A^3 - A)(Y_{i+1} - Y_i)^2$$

$$D = \frac{1}{6}(B^3 - B)(Y_{i+1} - Y_i)^2$$

Here, i in Eqs. 1 and 2 is an argument indicating a point at which the surface potential is measured, and i is a natural number satisfying 1=<i=<10. And, Y means a coordinate of any position on the Y' axis. Thus, Eq. 1 estimates a potential $V_L$ of any position on the Y' axis on the (−) side by spline interpolation using measured data of adjacent points on both sides. Equations indicating the potential distribution $V_U$ on the Y' axis on the (−) side are basically same as Eqs. 1 and 2. However, the argument i is different from that in the Eqs. 1 and 2.

Next, using the obtained interpolated potential data (i.e. the potential distribution obtained on the line by the first interpolation) on the Y' axis, second interpolation is performed to estimate the surface potential at any position (X, Y) on the semiconductor wafer 13. Since the semiconductor wafer 13 is usually circular, calculation becomes simpler when the Rθ polar coordinate system is used rather than the X'-Y' orthogonal coordinate system. Thus, the following Eqs. 3 and 4 are used to transform the coordinate value (X, Y) on the wafer into the coordinate value (R, θ).

$$R = \sqrt{(X)^2 + (Y)^2} \qquad \text{Eq. 3}$$

$$\tan\theta = Y/X \qquad \text{Eq. 4}$$

Figure 4B:
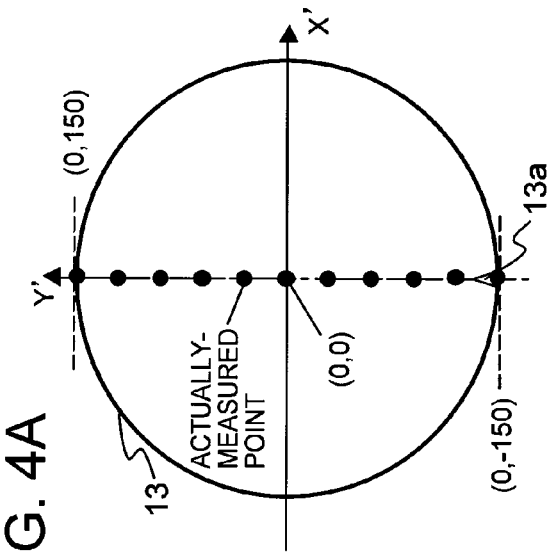

The potential V at any position (X, Y) (=(R, θ)) on the semiconductor wafer 13 is obtained by weighting each of the above-obtained potential $V_U$ on the positive axis and potential $V_L$ on the negative axis, as shown in Eq. 5. This equation Eq. 5 is an equation that interpolates between two points on the Y' axis, which are adjacent in the circumferential direction, i.e. on a prescribed radius R, as shown in FIG. 4B.

$$V = EV_L + FV_U \qquad \text{Eq. 5}$$

Here, the weighting factors E and F in Eq. 5 are determined by the conditions shown in FIG. 6 considering the characteristics of electrification (i.e. symmetric property to some degree, electrification potential 0 outside the wafer area).

$$E + F = 1 \qquad \text{Eq. 6}$$

$$\frac{\partial E}{\partial \theta} = 0 \; \frac{\partial F}{\partial \theta} = 0 \Big|_{\theta = 0°\, 180°}$$

$$E = 0 \; F = 1 \big|_{\theta = 180°}$$

$$E = 1 \; F = 0 \big|_{\theta = 0°}$$

For example, functions shown in Eq. 7 satisfy this condition.

$$E = \cos^2\left(\frac{\theta}{2}\right) \qquad \text{Eq. 7}$$

$$F = \sin^2\left(\frac{\theta}{2}\right)$$

The two-dimensional interpolation function generation part 224 of the integrated control part 220 generates the above equations and stores them in the two-dimensional interpolation function storage part 233, as described above. Then, the observation point potential calculation part 226 obtains the potential at the observation point (R, θ) on the semiconductor wafer 13 by substituting the value (R, θ) into the interpolation function expressed by the above equations.

Figure 4C:
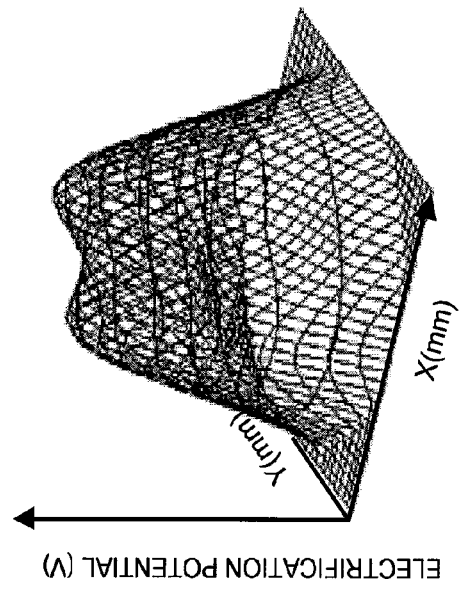
Figure 4D:
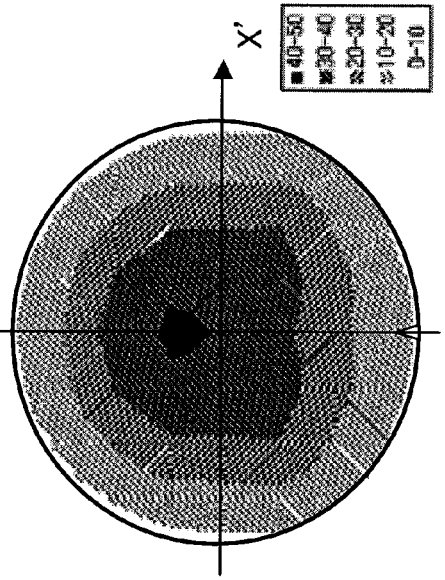

FIG. 4C and FIG. 4D show the resultant surface potential obtained for any position (X, Y) (=(R, θ)) on the semiconductor wafer 13 by using the two-dimensional interpolation function expressed by the above equations. Here, FIG. 4C shows two-dimensionally the potential distribution, and FIG. 4D shows three-dimensionally.

Figure 5A:
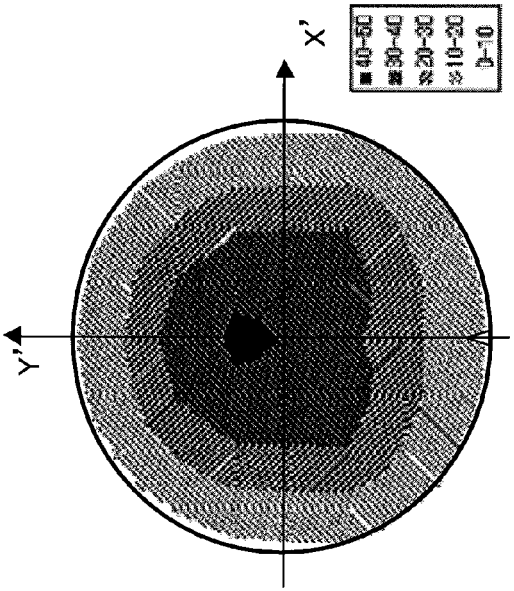
FIGS. 5A and 5B are explanatory diagrams showing potential distribution estimation results according to the conventional method and the first embodiment.
Figure 5A:
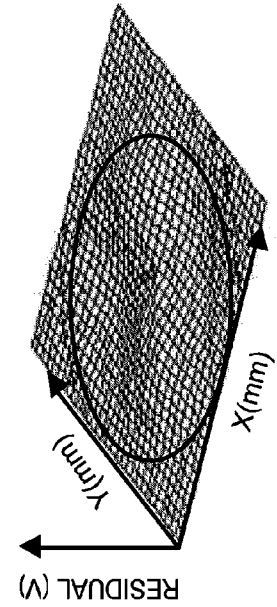
Figure 5B:
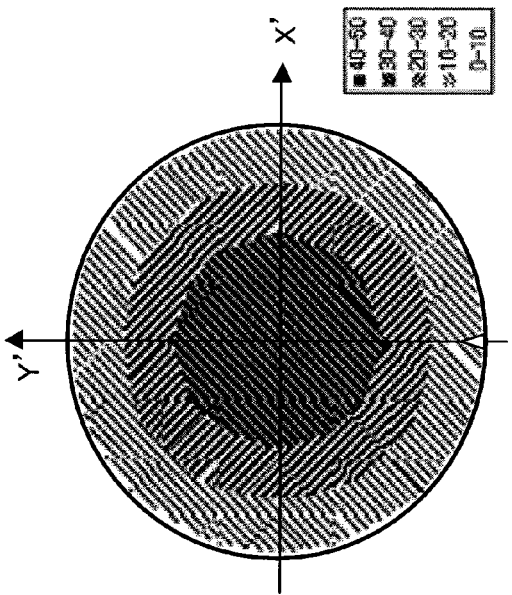
Figure 5B:
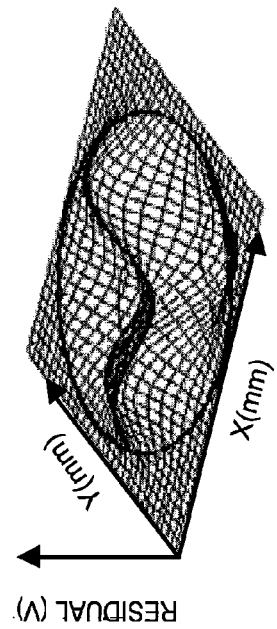

Here, referring to FIGS. 5A and 5B, the potential distribution calculation method in the present embodiment will be compared with the conventional potential calculation method described in Patent Document 1. FIG. 5A shows the result obtained by the conventional method, and FIG. 5B shows the result obtained by the method of the present embodiment. The upper area of FIGS. 5A and 5B show two-dimensionally potential distributions obtained by these methods respectively, and the lower area of FIGS. 5A and 5B show three-dimensionally respective residuals between the potential distributions obtained by these methods and the actually-measured potential distributions.

As described in the "Background of the Invention", the conventional method uses actually-measured values at a plurality of points within the radius of the semiconductor wafer, approximates the potential distribution within the radius by a quartic function, and rotate the quartic function about the center of the wafer, to obtain a potential distribution function. As a result, the potential distribution on the wafer, which is obtained by this function, is rotationally symmetric, as shown in the upper area of FIG. 5A. Further, as shown in the lower area of FIG. 5A, the residual is larger on the Y' axis. It is considered that this is caused by discontinuity of potentials between the start position and end position of rotation when one-dimensional interpolation data are rotated simply within a plane.

On the other hand, in the method of the present embodiment, it can be seen that the potential distribution on the wafer is asymmetric, as shown in the upper area of FIG. 5B. Further, as shown in the lower area of FIG. 5B, the residual is smaller as a whole, and thus it can be understood that the potential distribution close to the actual distribution has been obtained.

Thus, when the potential distribution on the wafer is estimated according to the present embodiment, the potential distribution on the wafer can be estimated accurately, and as a result, a suitable retarding potential can be set in a short time. Further, the adjustment time between the finish of the stage movement and the start of measurement can be shortened. In detail, the method of the present embodiment and the conventional method were compared regarding the time required for adjusting the retarding potential under the same conditions except for the method of estimating the surface potential distribution. As a result, the conventional method took 10 seconds for each of twenty observation points on a semiconductor wafer 13, i.e. 200 seconds in total. On the other hand, the method of the present embodiment took 10 seconds each for only five observation points on the semiconductor wafer 13, 3 seconds each for other eight observation points, and only 1 second each for the other seven observation points. In other words, the adjustment time per semiconductor wafer 13 was shortened from 200 seconds to 81 seconds.

As described above, the present embodiment can shorten the time required before start of measurement, and thus can realize a scanning electron microscope that does not cause stress on a user. Further, when the present embodiment is applied to a measurement/inspection apparatus such as a length-measuring SEM, a review SEM or an appearance inspection apparatus, it is possible to realize an apparatus whose processing time per wafer is shorter and throughput is higher than that of the conventional apparatus. Further, in the case where a larger number of surface potential observation points are used, the prediction accuracy is improved and it becomes possible to perform focusing by using only prediction of surface potential distribution.

Second Embodiment

Figure 7:
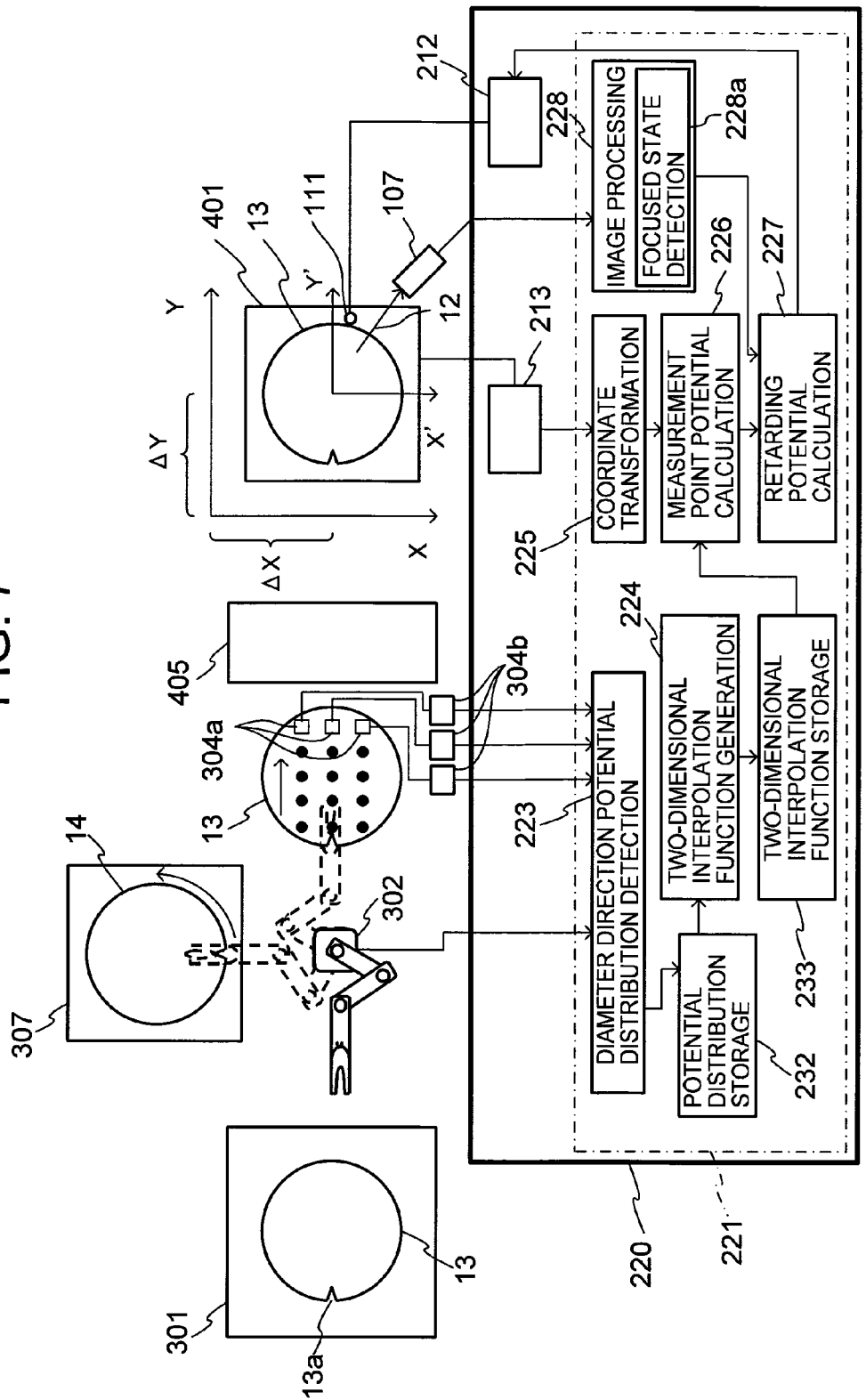
FIG. 7 is an explanatory diagram showing a functional configuration of an integrated control part and a configuration of a transfer system of a second embodiment according to the present invention.

In the first embodiment, potentials are measured only at points located on the Y' axis, i.e. on the line passing through the center of a semiconductor wafer 13 and its notch 13a. In a second embodiment, as shown in FIG. 7, three detection probes 304a are provided in the direction of the X' axis to improve the accuracy of detecting of potential distribution. Thus, potentials at points on three lines parallel to the Y' axis are measured, and a two-dimensional interpolation function is obtained on the basis of the measured potential at these points. That is to say, the scanning electron microscope system of the present embodiment is different from the system of the first embodiment in that the three potential measuring units 304 are provided and a two-dimensional interpolation function is obtained on the basis of potentials measured by these potential measuring units 304, while the other characteristics are similar to those of the first embodiment. Thus, description of a configuration of the scanning electron microscope as a whole, each component and a general flow of operation will be omitted.

Figure 8A:
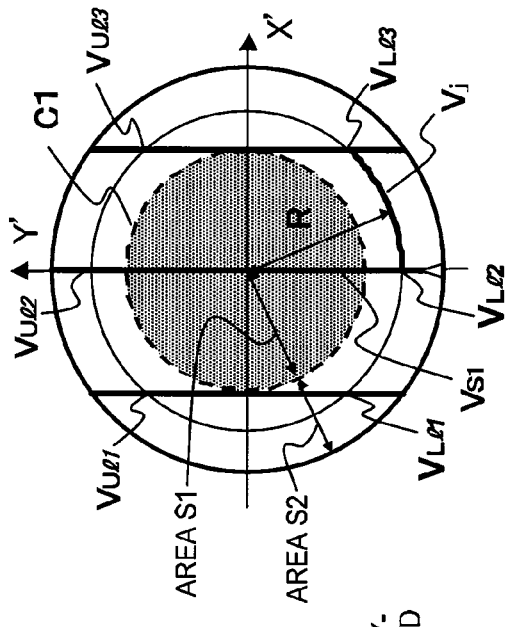
FIGS. 8A, 8B and 8C are explanatory diagrams for the second embodiment according to the present invention.

As shown in FIG. 8A, here also a semiconductor wafer 13 having the diameter of 300 mm is considered similarly to the first embodiment. As described above, in the present embodiment, potentials are measured at points on the Y' axis and points on two lines parallel to the Y' axis. Here, the three lines are located at intervals of 90 mm. In other words, in the present embodiment, the three potential detection probes 304a are arranged at intervals of 90 mm on a line in the direction of the X' axis.

The surface potentials of the wafer are measured at nine points on a line (hereinafter, referred to as the line 1) that is parallel to the Y' axis and passes through a point (−90, 0) in the X'-Y' coordinate system having its origin at the center of the wafer, eleven points (same as the observation points in the first embodiment) on the Y' axis (hereinafter, referred to as the line 2), and nine points on a line (hereinafter, referred to as the line 3) that is parallel to the Y' axis and passes through a point (90, 0), i.e. twenty-nine points in total.

A method of obtaining a two-dimensional interpolation function by using the above observation points will be described.

First, first spline interpolation is performed using Eqs. 1 and 2 described in the first embodiment to obtain a potential distribution for each of the three lines. Next, similarly to the first embodiment, a coordinate value (X, Y) on the wafer is transformed into a coordinate value (R, θ) by using Eqs. 3 and 4.

Figure 8B:
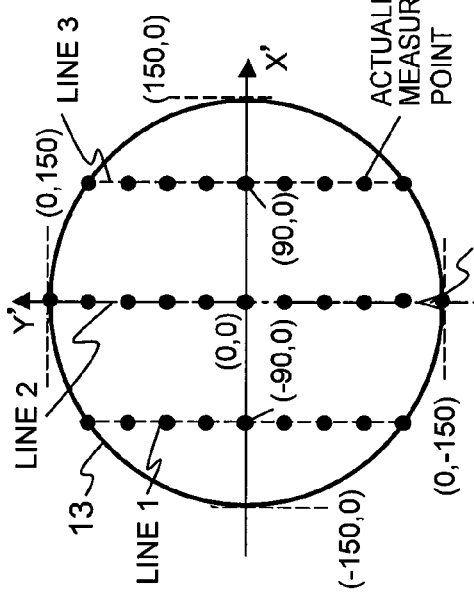

As shown in FIG. 8B, in an inside area of a circle C1 that is centered at the origin and has a radius of 90 mm, i.e. a circle whose diameter is the distance between the line 1 and the line 3, there is no circle that has any radius and intersects the lines 1 and 3. Thus, potential distribution is estimated separately in the area (the area S1) inside the circle C1 and in the area (the area S2) on the outer side of the circle C1.

Relation between the shape of the area S1 and locations of observation points in this area S1 is basically same as that in the first embodiment. Thus, a two-dimensional interpolation function showing potential in the area S1 becomes that specified by Eq. 5 using only the information at points on the line 2, i.e. on the Y' axis similarly to the first embodiment, without using information at locations on the lines 1 and 3.

A two-dimensional interpolation function showing potential in the area S2 uses all information at points on the lines 1-3 in the area S2. Considering a circle that has any radius $R_j$ and is included in the area S2, it is found that the circle in question includes six points at which the circle intersects one of the lines 1-3. The θ components of coordinates of these intersection points are written as $θ_1$, $θ_2$, $θ_3$, $θ_4$, $θ_5$ and $θ_6$. Expressing the potentials at the locations of these coordinates $θ_1$-$θ_6$ as $V(R_j, θ_i)|\{i: 1-6\}$, the potential at any location on the above radius $R_j$ can be shown by the following equation Eq. 8 when second spline interpolation is performed using potentials at locations adjacent in the θ direction.

$$V(R_j,\theta)=AV(R_j,\theta_i)+BV(R_j,\theta_{i+1})+CV''(R_j,\theta_i)+DV''(R_j,\theta_{i+1}) \quad \text{Eq. 8}$$

Here, j is an argument for indicating a specific radius R in the area S2. Further, each coefficient A, B, C, D in the equation Eq. 8 is defined as in Eq. 9.

$$A = \frac{\theta(i+1)-\theta}{\theta(i+1)-\theta(i)}$$

$$B = \frac{\theta-\theta(i)}{\theta(i+1)-\theta(i)} \quad \text{Eq. 9}$$

$$C = \frac{1}{6}(A^3-A)(\theta(i+1)-\theta(i))^2$$

$$D = \frac{1}{6}(B^3-B)(\theta(i+1)-\theta(i))^2$$

Figure 8C:
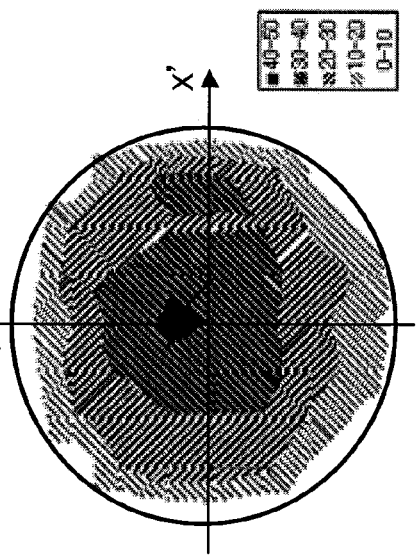

Using the two-dimensional interpolation functions obtained by the above-described methods, i.e. the two-dimensional interpolation function shown in Eq. 5 for the inside of the area S1 and the two dimensional interpolation function shown in Eq. 7 for the inside of the area S2, the obtained surface potential for any position (X, Y) (=(R, θ)) on the semiconductor wafer 13 is shown in FIG. 8C. As shown in the figure, it is found that the surface potential distribution obtained in the present embodiment is emphasized in its asymmetry in comparison with the surface potential distribution that is obtained in the first embodiment and shown in FIG. 4C. In other words, more accurate potential distribution can be obtained by the present embodiment in comparison with the first embodiment.

In the present embodiment, a two-dimensional interpolation function is obtained by measuring surface potentials on three lines on a semiconductor wafer 13. However, surface potentials may be measured on two or four or more lines, to obtain a two-dimensional interpolation function. In such a case, considering the symmetry of distribution of electrification, it is favorable that the line passing through the center of a specimen is always included. Accordingly, in the case where potentials are measured on a plurality of lines, it is favorable that the number of lines on which potentials are measured is an odd number (the line passing through the center and n lines on both sides) rather than an even number. However, even if the number of lines on which potentials are measured is increased more than some number, the improving effect on the potential estimation accuracy reduces gradually. Practically, it is favorable that the number of potential measuring units is between three and five.

As described above, the present embodiment can further shorten the adjustment time in comparison with the first embodiment, and can raise throughput of measurement and inspection.

Third Embodiment

In the first and second embodiments, potentials are measured only at points on a line or lines on a semiconductor wafer 13. Considering that potential distribution changes continuously also in the circumferential direction of a semiconductor wafer 13, it is expected that the estimation accuracy will be improved when potentials are measured also at a plurality of points in the circumferential direction of the semiconductor wafer 13 and thus-measured data also are used.

Thus, in the present embodiment, potentials at a plurality of points located in the wafer's circumferential direction (i.e. the θ direction) are measured also, and a two-dimensional interpolation function is obtained by using thus-measured data also.

Figure 9:
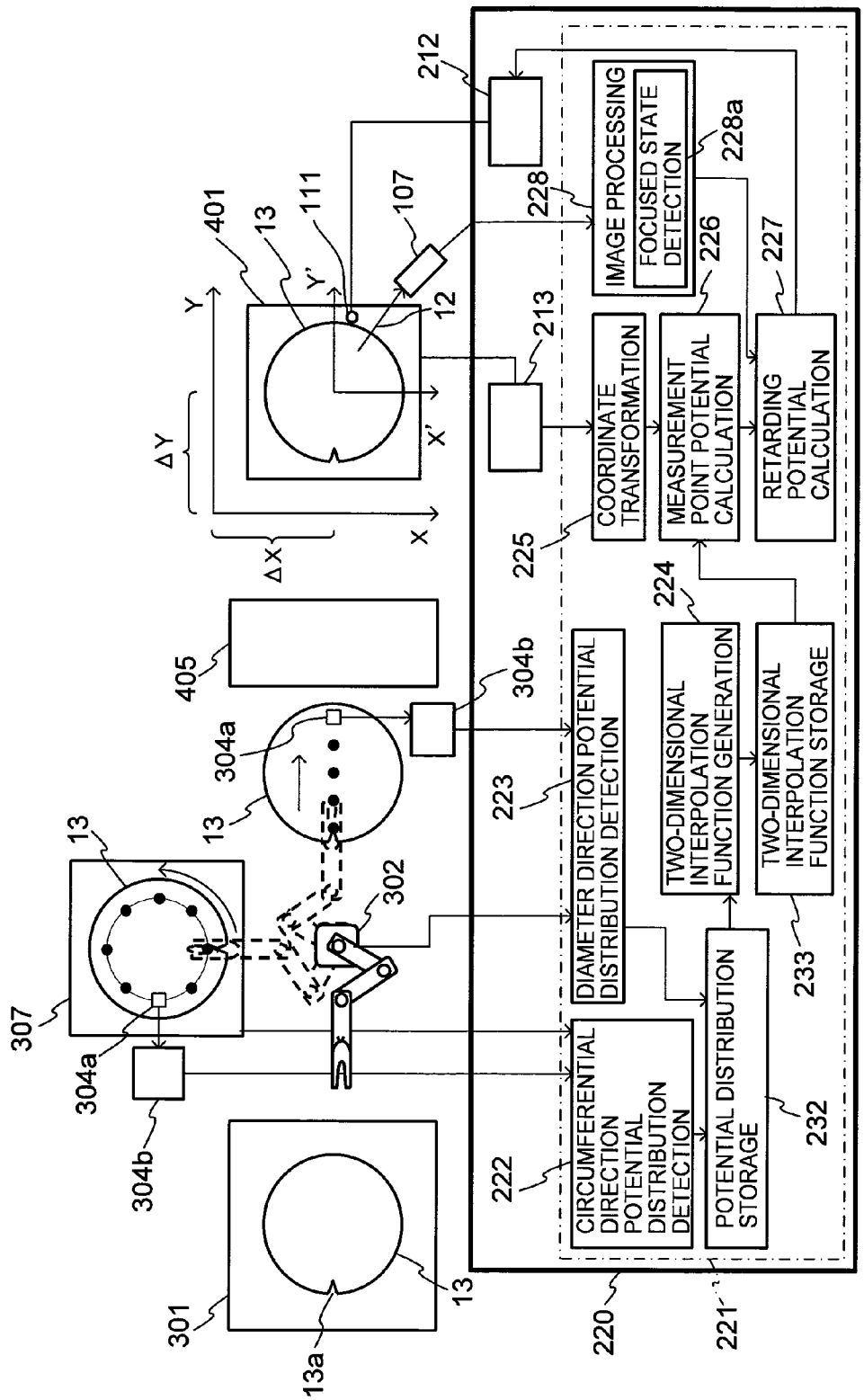
FIG. 9 is an explanatory diagram showing a functional configuration of an integrated control part and a configuration of a transfer system of a third embodiment according to the present invention.

As shown in FIG. 9, in the present embodiment, a potential detection probe 304a is provided also in the aligner 307 on which a semiconductor wafer 13 is rotated, in addition to a potential detection probe 304a arranged in the linear transfer path for the semiconductor wafer 13. By providing a potential detection probe 304a in the aligner 307, it becomes possible to detect also potentials at a plurality of points in the circumferential direction of a semiconductor wafer 13. In the present embodiment, a potential detection probe 304a is provided in the aligner 307. However, a mechanism for rotating a semiconductor wafer 13 may be provided separately so that a potential detection probe 304a is placed in this mechanism. However, from the viewpoint of observation efficiency, the present embodiment is more preferable than the case where the mechanism for rotating a semiconductor wafer 13 is provided separately.

Functional components of the integrated control part 220 of the present embodiment are basically similar to those of the first embodiment. However, in the present embodiment, the integrated control part 220 further comprises a circumferential direction potential distribution detection part 222 for detecting also potentials at a plurality of points in the circumferential direction, in addition to the functional components of the integrated control part 220 of the first embodiment. The circumferential direction potential distribution detection part 222 obtains a potential distribution in the circumferential direction of a semiconductor wafer 13 on the basis of potential information received from the potential measuring unit 304 whose probe 304a is positioned in the aligner 307 and angle information received from a rotary encoder or the like of the aligner 307. The circumferential direction potential distribution detection part 222 stores the obtained potential distribution in the potential distribution storage part 232. This potential distribution storage part 232 stores a wafer rotation angle θ and a potential at that angle θ in association with the angle θ.

Figure 10:
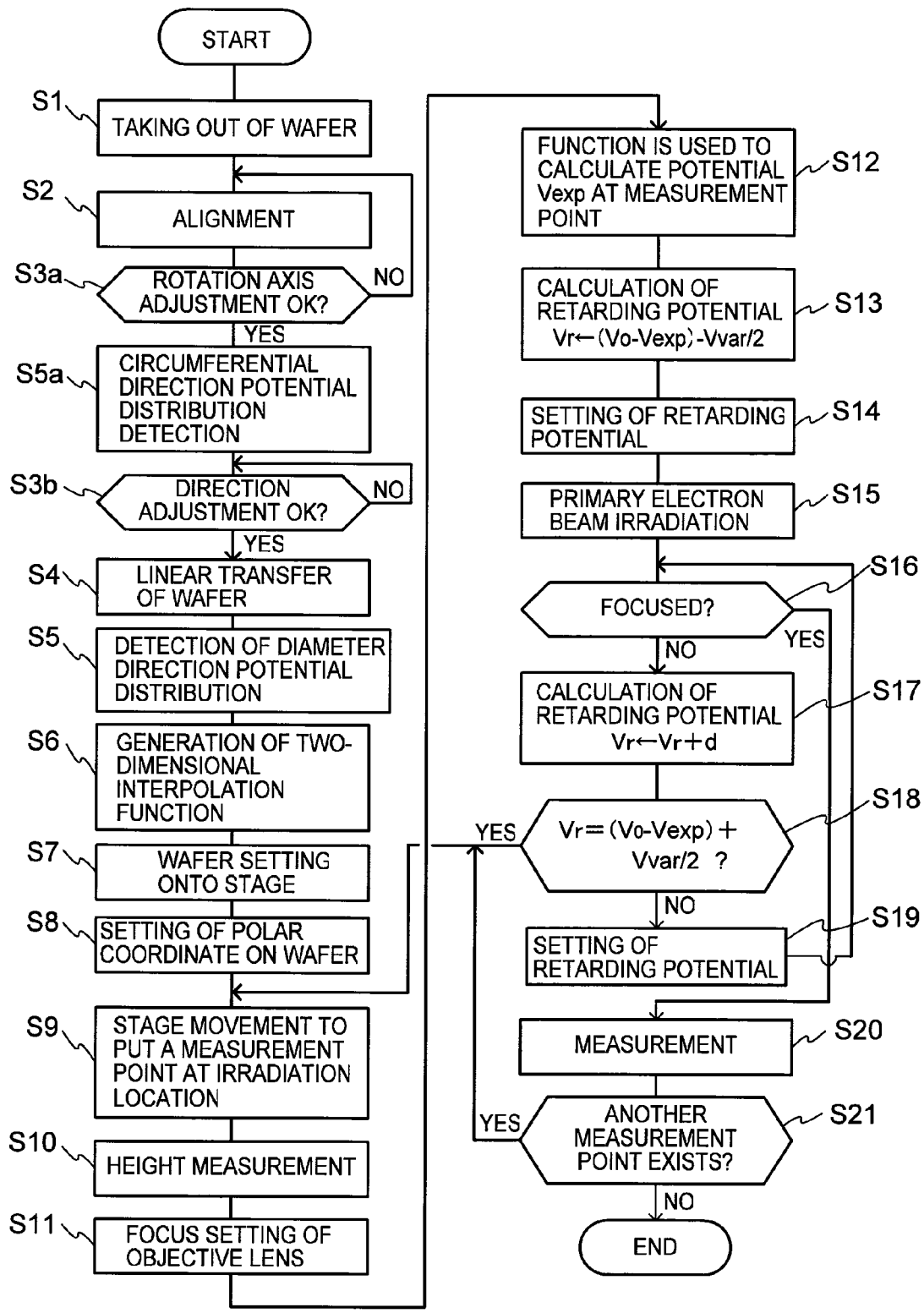
FIG. 10 is a flowchart showing operation of the integrated control part of the third embodiment according to the present invention.

Next, operation of the integrated control part 220 of the present embodiment will be described referring to the flowchart shown in FIG. 10.

Figure 3:
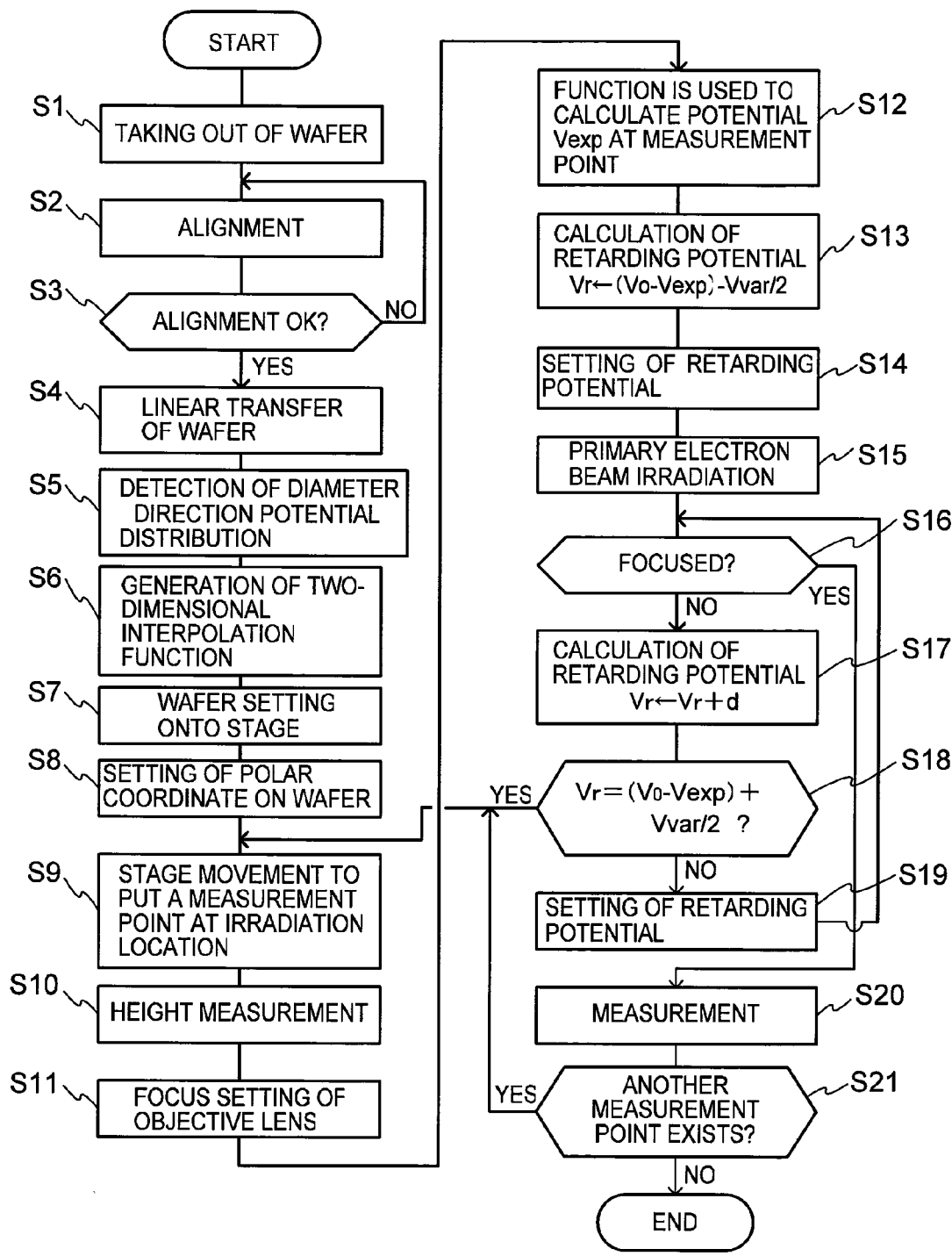
FIG. 3 is a flowchart showing operation of the integrated control part of the first embodiment according to the present invention.

Similarly to the operation of the first embodiment shown in FIG. 3, in the present embodiment, the integrated control part 220 gives a wafer taking out instruction (S1) and an alignment-by-aligner instruction (S2). Next, with regard to adjustments by the aligner 307, i.e. adjustment of the rotation axis of the semiconductor wafer 13 and adjustment of the direction of the wafer 13, first the integrated control part 220 judges whether the rotation axis has been adjusted properly, i.e. whether the center of rotation of the aligner 307 coincides with the center of the semiconductor wafer 13 (S3a).

When it is judged that the center of rotation of the aligner 307 coincides with the center of the semiconductor wafer 13, then the circumferential direction potential distribution detection part 222 of the integrated control part 220 detects potential distribution in the circumferential direction while the aligner 307 keeps rotating the semiconductor wafer 13 (S5a). As described above, the circumferential direction potential distribution detection part 222 obtains potential information of a plurality of points of the rotating semiconductor wafer from the potential measuring unit 304 whose probe 304a is positioned in the aligner 307 and angle information of these points from the rotary encoder or the like of the aligner 307, and stores the obtained information in the potential distribution storage part 232. When this circumferential potential distribution detection is finished, then the integrated control part 220 judges whether the direction has been adjusted properly, i.e. whether the notch 13a of the semiconductor wafer 13 faces a prescribed direction or not (S3b).

When it is judged that the notch 13a of the semiconductor wafer 13 faces the prescribed direction, then the rotation of the semiconductor wafer 13 by the aligner 307 is stopped immediately, and the wafer transfer unit 302 transfers the semiconductor wafer 13 linearly toward the specimen exchange chamber 405 (S4). Then, similarly to the first embodiment, potential distribution on the semiconductor wafer 13 is detected in the linear direction (S5). Thereafter, the integrated control part 220 operates in a manner basically similar to the first embodiment.

Next, a method of generating a two-dimensional interpolation function in the present embodiment will be described referring to FIGS. 11A, 11B, 11C and 11D.

Figure 11B:
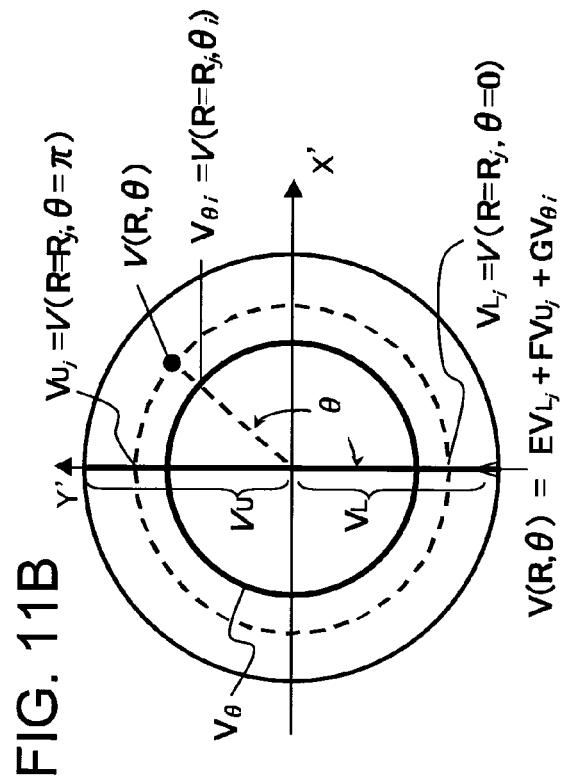
FIGS. 11A, 11B, 11C and 11D are explanatory diagrams for the third embodiment according to the present invention.
Figure 11D:
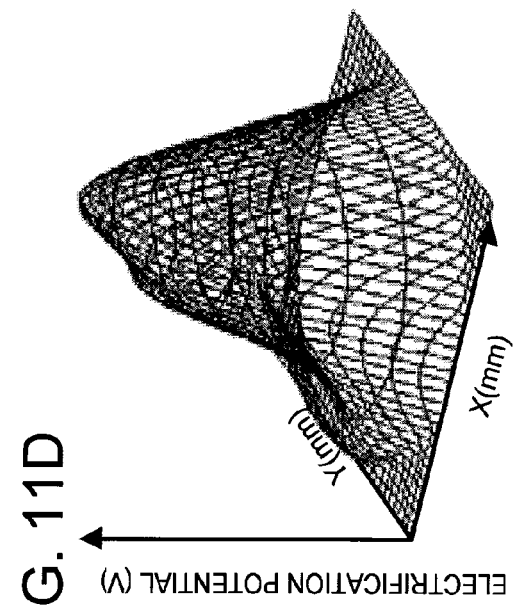
Figure 11A:
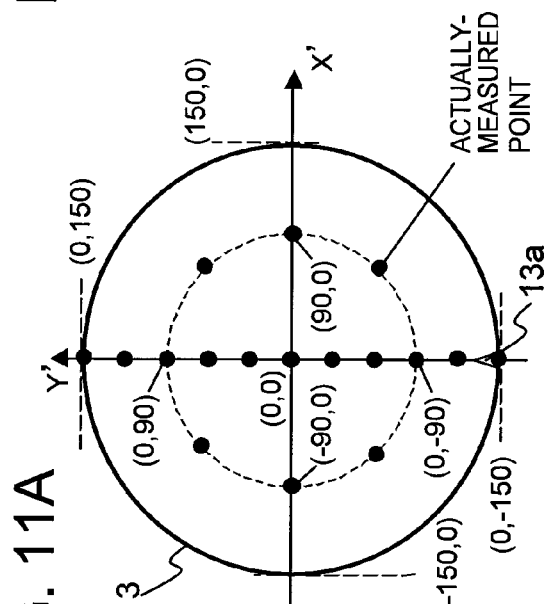

As shown in FIG. 11A, similarly to the first embodiment, a semiconductor wafer 13 having the diameter of 300 mm is considered here also. As described above, in the present embodiment, potentials are measured at points on the Y' axis and at points on a circle whose center is positioned at the center of the semiconductor wafer 13. The radius of this circle is 90 mm.

Wafer surface potentials are measured at eleven points on the Y' axis of the X'-Y' coordinate system having its origin at the center of the wafer and eight points on the circle having the radius of 90 mm including a point at (0, −90), a point at (90, 0), a point at (0, 90) and a point at (−90, 0), i.e. nineteen points in total.

To generate a two-dimensional interpolation function by using the measured data, first the spline interpolation is performed with respect to the measured data of the eleven points on the Y' axis by using Eqs. 1 and 2 described in the first embodiment, to obtain potential distributions $V_U$ and $V_L$ on the Y' axis.

Next, a potential distribution on the circle of the radius 90 mm is obtained. Writing surface potential at any location (R, θ) of the wafer as V(R, θ), potential distribution $V_θ$ on the circle is written as V(R=90, θ). When "R=90" is generalized to $R_j$, the interpolation function can be written as Eq. 10.

$$V(R_j,θ)=AV(R_j,θ_i)+BV(R_j,θ_{i+1})+CV''(R_j,θ_i)+DV''(R_j,θ_{i+1})$$ Eq. 10

Here, each coefficient A, B, C, D in the equation Eq. 10 is defined as follows.

$$A = \frac{θ_{i+1} - θ}{θ_{i+1} - θ_i}$$ Eq. 11

$$B = \frac{θ - θ_i}{θ_{i+1} - θ_i}$$

$$C = \frac{1}{6}(A^3 - A)(θ_{i+1} - θ_i)^2$$

$$D = \frac{1}{6}(B^3 - B)(θ_{i+1} - θ_i)^2$$

In Eqs. 10 and 11, the argument j is an argument for indicating a specific position in the radial direction, and the argument i an argument for indicating a specific position in the θ direction.

Next, as shown in FIG. 11B, interpolation operation is performed by using the above-described $V_U$, $V_L$ and $V(R_j, θ_i)$, to calculate potential for any location on the wafer. The interpolation formula that describes the surface potential V(R, θ) at any location (R, θ) on the wafer can be expressed as in Eq. 12 using potentials $V_{Lj}$, $V_{Uj}$ at intersection points (R, 0) and (R, π) of a circle of the radius R and the Y axis, and a potential $V(R=R_j, θ)$ at an intersection point of that $V_θ$ and a line segment connecting the point (R, θ) and the origin. In other words, Eq. 12 is obtained by weighting $V_U$, $V_L$ and $V(R_j, θ_i)$ and adding the results.

$$V=EV_{Lj}+FV_{Uj}+GV_{θi}$$ Eq. 12

Here, $V_{θi}$ is a simplified expression for $V(R=R_j, θ)$ and is used in order to avoid complication. FIG. 11B shows the above relations.

Further, each coefficient in the equation Eq. 12 is defined to satisfy the following conditions.

$$E + F + G = 1$$ Eq. 13

$$\frac{∂E}{∂θ} = 0 \quad \frac{∂F}{∂θ} = 0 \bigg|_{θ=0°\ 180°}$$ Eq. 14

$$E = 0 \quad F = 1 \mid_{θ=180°}$$

$$E = 1 \quad F = 0 \mid_{θ=0°}$$

$$\frac{∂E}{∂R} = 0 \quad \frac{∂F}{∂R} = 0 \quad \frac{∂G}{∂R} = 0 \mid_{R=0\ 90mm\ 150mm}$$ Eq. 15

$$G = 0 \mid_{R=0mm} \quad G = 1 \mid_{R=90mm} \quad G = 0 \mid_{150mm}$$

$$E = 0 \quad F = 0 \mid_{90mm≤R≤150}$$

As a function satisfying the above equations Eqs. 13-15, there is a function shown in Eq. 16, for example.

$$E = \cos^2\left(\frac{θ}{2}\right)\cos^2\left(90°\frac{R}{90\text{ mm}}\right)$$ Eq. 16

$$F = \sin^2\left(\frac{θ}{2}\right)\cos^2\left(90°\frac{R}{90\text{ mm}}\right)$$

$$G = \sin^2\left(90°\frac{R}{90\text{ mm}}\right)\bigg|_{R≤90mm}$$

$$E = \cos^2\left(\frac{θ}{2}\right)\cos^2\left(90°\frac{150\text{ mm} - R}{60\text{ mm}}\right)$$

$$F = \sin^2\left(\frac{θ}{2}\right)\cos^2\left(90°\frac{150\text{ mm} - R}{60\text{ mm}}\right)$$

$$G = \sin^2\left(90°\frac{150\text{ mm} - R}{60\text{ mm}}\right)\bigg|_{R≥90mm}$$

Figure 11C:
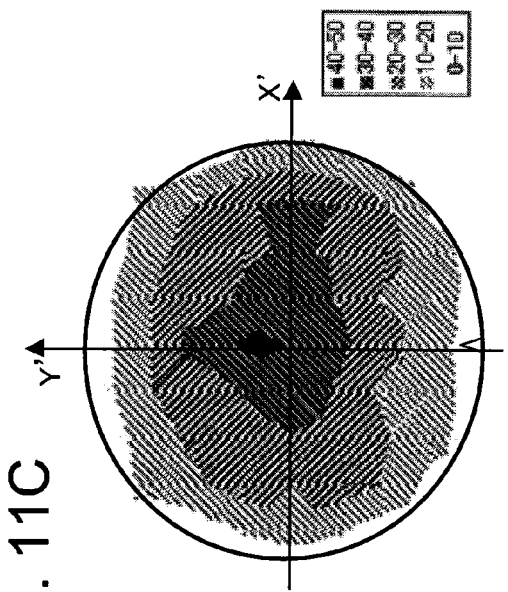

FIGS. 11C and 11D show the resultant surface potential for any location (X, Y) (=(R, θ)) on the semiconductor wafer 13, which has been obtained by using the two-dimensional interpolation function shown as Eq. 12. Here, FIG. 11C shows the potential distribution two-dimensionally, and FIG. 11D shows the potential distribution three-dimensionally.

Figure 12B:
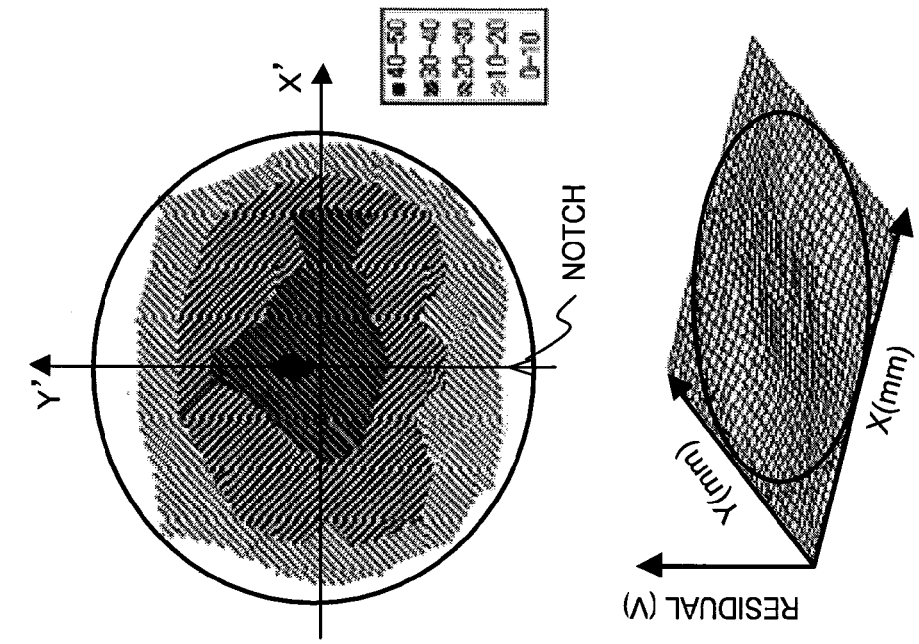
FIGS. 12A and 12B are explanatory diagrams showing results of estimation of potential distribution by the methods of the first and third embodiments.
Figure 12A:
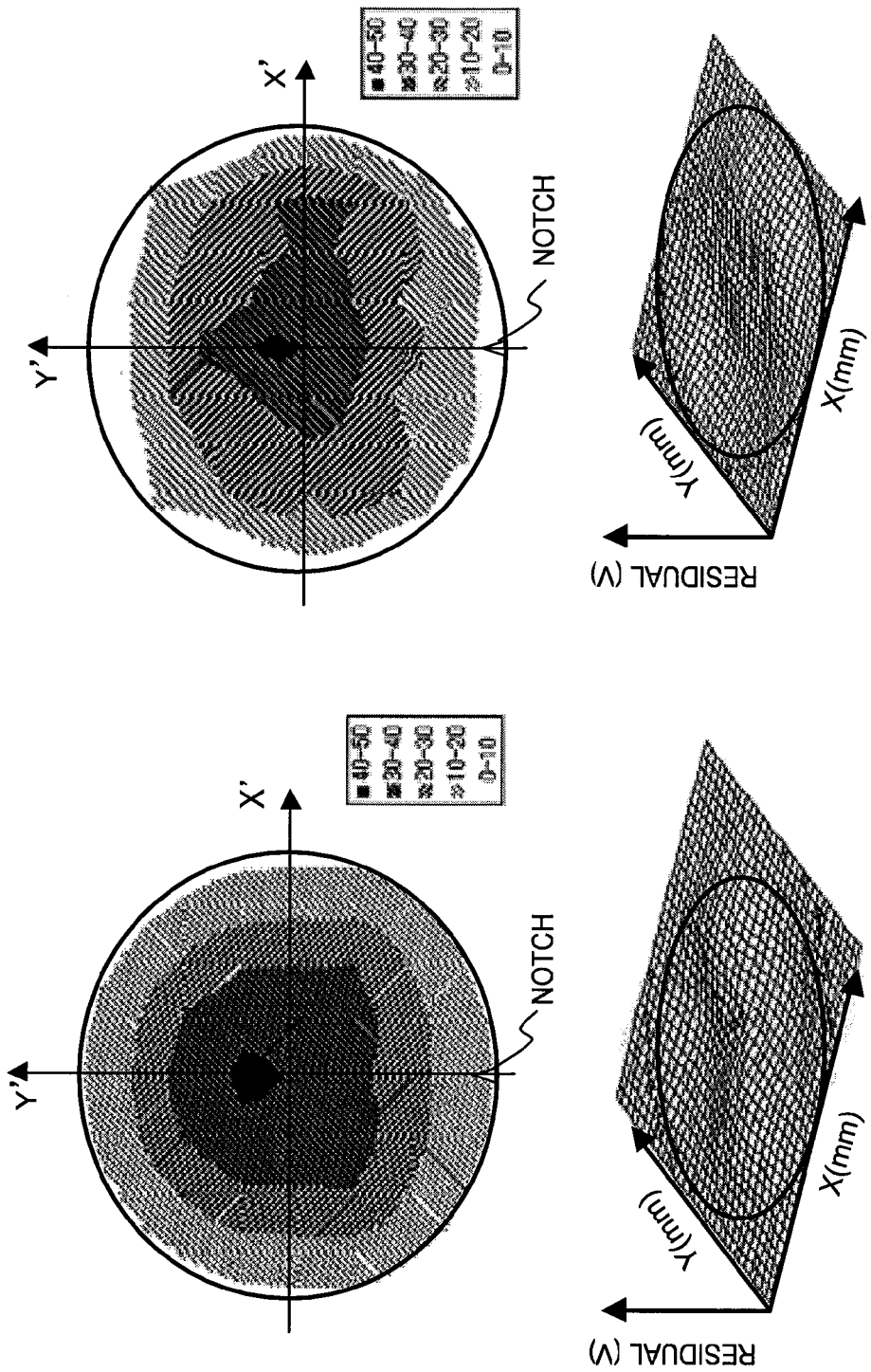

Here, referring to FIGS. 12A and 12B, the potential distribution calculation method in the present embodiment will be compared with the potential distribution calculation method in the first embodiment. FIG. 12A shows the result obtained by the method of the first embodiment, and FIG. 12B shows the result obtained by the method of the present embodiment. The upper area of FIGS. 12A and 12B show two-dimensionally potential distributions obtained by these methods respectively, and the lower area of FIGS. 12A and 12B show three-dimensionally respective residuals between the potential distributions obtained by these methods and the actually-measured potential distributions. It can be seen from the figure that the potential distribution obtained by the present embodiment expresses asymmetry of the distribution better, meaning that the result closer to the actual potential distribution has been obtained. Further, although not shown here, the method of the present embodiment can obtain potential distribution closer to the actual potential distribution than that obtained by the method of the second embodiment, in many cases.

Thus, in comparison with the first and second embodiments, the present embodiment can further shorten the adjustment time between the finish of the stage movement and the start of measurement. In detail, the method of the present embodiment and the method of the first embodiment were compared regarding the time required for adjusting the retarding potential under the same conditions except for the methods of estimating the surface potential distribution. As a result, the method of the first embodiment took 10 seconds each for five points among twenty observation points on the semiconductor wafer 13, three seconds each for eight points, 1 second each for the other seven points, i.e. 81 seconds in total. On the other hand, according to the method of the present embodiment, the adjustment took 10 seconds each for only two points among the twenty points, three seconds each for eight points, and 1 second for ten points, i.e. only 54 seconds in total. In other words, it was possible to shorten the adjustment time per semiconductor wafer from 81 seconds in the first embodiment to 54 seconds.

As described above, the present embodiment can realize a scanning electron microscope whose adjustment time is further shorter than those of the first and second embodiments. Further, it goes without saying that, when the present embodiment is applied to a measurement/inspection apparatus such as a length-measuring SEM, a review SEM or an appearance inspection apparatus, throughput higher than those of the first and second embodiments can be realized. In that case, larger the number of observation points per wafer is, higher the throughput improvement effect as a whole is. In particular, when the present invention is applied to an appearance inspection apparatus or a review SEM, this effect is larger.

The above embodiments have been described taking an example of a scanning electron microscope. However, it goes without saying that the methods of these embodiments can be applied widely to charged particle beam apparatuses in general (such as ion beam processing apparatuses and ion beam irradiation apparatuses) as far as they are systems in which focus deviation due to electrification becomes a problem (i.e. not only systems using an electron beam but also systems using an ion beam, for example).

Further, in the above embodiments, a semiconductor wafer has been mentioned as an example of specimen. The present invention, however, is not limited to a semiconductor wafer, and can be applied to other kinds of specimens such as a glass substrate, a magnetic disk substrate, a metal substrate formed with insulating film or the like, for example.

Further, a potential measuring unit 304 having a detection probe 304a has been used as a potential measurement means for measuring the surface potential of a specimen. However, other measuring devices such as a potential measuring device using the absorption current measurement method may be employed, for example. Further, such a measuring unit may be arranged at any location. The arrangements shown in the above embodiments are ones that are favorable from the viewpoint of throughput only.

Further, in the above embodiments, the polar coordinate system has been used for obtaining a two-dimensional potential distribution function. However, any coordinate system, such as an orthogonal coordinate system or a non-orthogonal coordinate system for example, can be employed as far as it can express a two-dimensional interpolation function, i.e. it is a coordinate system having two base vectors.

Further, in the above embodiments, estimated potentials have been used for obtaining a retarding potential for focus adjustment, which is a setting parameter of an electron beam optical system 10. However, not only the retarding potential but also the estimated potentials may be used for obtaining the amplitude of a driving signal of the scanning deflector, the exciting current of the objective lens 106, the focus drive voltage of the objective lens 106, or the like. Further, the estimated potentials may be used in the pre-dose technique in which a wafer is irradiated with an electron beam before obtaining an SEM image of the wafer, in order to control the electrification potential of the wafer.

The invention claimed is:

1. A charged particle beam apparatus comprising:
a charged particle beam optical system that irradiates a specimen housed in a specimen chamber with a primary charged beam, detects a secondary charged particle beam generated from the specimen, and outputs a signal of a detection result;
first potential measuring means measures potentials on a surface of the specimen at a plurality of locations on a line segment including a center location of the specimen before irradiation of the specimen with the primary charged beam during transfer of the specimen towards a specimen stage of the charged particle beam optical system;
height measurement means, which measures a height of the surface of the specimen on the specimen stage before irradiation of the specimen with the primary charged beam; and
a control unit that controls the charged particle beam optical system on a basis of height information obtained by height measurement means and potential information obtained by the first potential measurement means,
wherein the control unit:
estimates a potential distribution for the line segment by a first interpolation on a basis of the potentials measured by the first potential measuring means before irradiation of the specimen with the primary charged beam; and
estimates a potential at any location on the specimen by a second interpolation in a circumferential direction of the specimen on a basis of the potential distribution estimated along the line segment before irradiation of the specimen with the primary charged beam.

2. A charged particle beam apparatus comprising:
a charged particle beam optical system that irradiates a specimen housed in a specimen chamber with a primary charged beam, detects a secondary charged particle beam generated from the specimen, and outputs a signal of a detection result;
first potential measuring means which measures potentials on a surface of the specimen at a first plurality of locations on a first line segment including a center location of the specimen, before irradiation of the specimen with the primary charged beam during transfer of the specimen towards a specimen stage of the charged particle beam optical system;
second potential measuring means, which measures potentials on a surface of the specimen at a second plurality of locations on a second line segment parallel to the first line segment, before irradiation of the specimen with the primary charged beam and during transfer of the specimen towards the specimen stage of the charged particle beam optical system;

third potential measuring means, which measures potentials on a surface of the specimen at a third plurality of locations on a third line segment parallel to the first line segment and such that the first line segment is interposed between the second line segment and the third line segment, before irradiation of the specimen with the primary charged beam and during transfer of the specimen towards the specimen stage of the charged particle beam optical system;

a control unit that controls the charged particle beam optical system on a basis of potential information obtained by the first, second and third potential measurement means, wherein the control unit:

estimates potential distributions for each of the first line segment, second line segment and third line segment using a first interpolation on a basis of the potentials measured by the first potential measuring means, second potential measuring means and third potential measuring means, respectively, estimates a potential distribution for a circular area of the surface of the specimen by a second interpolation in a circumferential direction of the specimen on a basis of the potential distribution of the first line segment included in the circular area, where the circular area is defined by a center location corresponding to the central location of the specimen and a radius equal to a distance between the first line segment and the third line segment, and estimates a potential distribution of an outer area defined by a periphery of the specimen and the circular area by a third interpolation in a circumferential direction of the specimen on a basis of the potential distributions of the first line segment, second line segment and third line segment included in the outer area.

3. A charged particle beam apparatus comprising:

a charged particle beam optical system that irradiates a specimen housed in a specimen chamber with a primary charged beam, detects a secondary charged particle beam generated from the specimen, and outputs a signal of a detection result;

first potential measuring means which measures potentials on a surface of the specimen at a first plurality of locations in a circumferential direction of the specimen along a circle defined by a center location of the specimen before irradiation of the specimen with the primary charged beam during transfer of the specimen towards a specimen stage of the charged particle beam optical system;

second potential measuring means, which measures potentials on a surface of the specimen at a second plurality of locations on a line segment including the center location of the specimen, before irradiation of the specimen with the primary charged beam during transfer of the specimen towards a specimen stage of the charged particle beam optical system;

a control unit that controls the charged particle beam optical system on a basis of potential information obtained by the first and second potential measuring means, wherein the control unit:

estimates a potential distribution for the line segment by a first interpolation on a basis of the potentials measured by the second potential measuring means at the plurality of second locations before irradiation of the specimen with the primary charged beam, estimates a potential distribution for the circle by a second interpolation in a circumferential direction of the specimen on a basis of the potentials measured by the first potential measuring means before irradiation of the specimen with the primary charged beam, and estimates a potential at any location on the surface of the specimen by a third interpolation in a circumferential direction of the specimen on a basis of the potential distribution estimated along the line segment and the potential distribution estimated for the circle before irradiation of the specimen with the primary charged beam.

4. A charged particle beam apparatus of claim 1, further comprising: a transfer mechanism for transferring the specimen into the specimen chamber; and the first potential measuring means is provided on a transfer path for the transfer mechanism to transfer the specimen.

5. A charged particle beam apparatus of claim 2, further comprising: a transfer mechanism for transferring the specimen into the specimen chamber; and the first potential measuring means is provided on a transfer path for the transfer mechanism to transfer the specimen.

6. A charged particle beam apparatus of claim 3, further comprising: a transfer mechanism for transferring the specimen into the specimen chamber; and the first potential measuring means is provided on a transfer path for the transfer mechanism to transfer the specimen.

7. A charged particle beam apparatus of claim 1, further comprising:

a transfer mechanism for transferring the specimen into the specimen chamber;

a specimen exchange chamber for storing the specimen temporarily before the specimen is brought into the specimen chamber; and the measurement of the potentials at the plurality of locations is performed during a linear transfer operation of the transfer mechanism to transfer the specimen into the specimen exchange chamber.

8. A charged particle beam apparatus of claim 2, further comprising:

a transfer mechanism for transferring the specimen into the specimen chamber;

a specimen exchange chamber for storing the specimen temporarily before the specimen is brought into the specimen chamber; and the measurement of the potentials by the first, second and third potential measurement means is performed during a linear transfer operation of the transfer mechanism to transfer the specimen into the specimen exchange chamber.

9. A charged particle beam apparatus of claim 3, further comprising:

a transfer mechanism for transferring the specimen into the specimen chamber;

a specimen exchange chamber for storing the specimen temporarily before the specimen is brought into the specimen chamber; and the measurement of the potentials by the first and second potential measurement means is performed during a linear transfer operation of the transfer mechanism to transfer the specimen into the specimen exchange chamber.

10. A charged particle beam apparatus of claim 1, wherein:

the control unit has a circumferential direction potential estimating means that executes the second interpolation.

11. A charged particle beam apparatus of claim 1, wherein:
the first potential measuring means measures potentials on a line segment including a center of the specimen and a notch on the specimen.

12. A charged particle beam apparatus of claim 2, wherein:
the first potential measuring means measures potentials on a line segment including a center of the specimen and a notch of the specimen.

13. A charged particle beam apparatus of claim 3, wherein:
the first potential measuring means measures potentials on a line segment including a center of the specimen and a notch of the specimen.

14. A charged particle beam apparatus of claim 11, further comprising: an aligner that performs angle adjustment of the specimen relative to the notch.

15. A charged particle beam apparatus of claim 1, wherein:
spline interpolation is employed for the first interpolation and the second interpolation.

16. A charged particle beam apparatus of claim 1, wherein:
a plurality of potential measuring means including the first potential measuring means measure the potentials on the surface of the specimen at a plurality of locations on three to five line segments.

17. A method of controlling a charged particle beam apparatus, in which a specimen is measured on a basis of distribution data of secondary charged particles generated by irradiating the specimen with a charged particle beam, comprising:

measuring a plurality of potentials on a line segment including a center of the specimen, before irradiation of the specimen with the primary charged beam and during transfer of the specimen towards a specimen stage of the charged particle beam optical system;

estimating a potential distribution for the line segment by a first interpolation on a basis of the potentials measured on the line segment before irradiation of the specimen with the primary charged beam;

estimating a potential at any location on a surface of the specimen by a second interpolation in a circumferential direction of the specimen on a basis of the potential distribution estimated along the line segment; and adjusting the charged particle beam apparatus according to the potential estimated by the second interpolation.

* * * * *